US009209569B2

(12) United States Patent
Schumacher

(10) Patent No.: US 9,209,569 B2
(45) Date of Patent: Dec. 8, 2015

(54) COMMUNICATIONS CONNECTORS INCLUDING TRANSMISSION LINES HAVING IMPEDANCE DISCONTINUITIES THAT IMPROVE RETURN LOSS AND/OR INSERTION LOSS PERFORMANCE AND RELATED METHODS

(71) Applicant: CommScope, Inc. of North Carolina, Hickory, NC (US)

(72) Inventor: Richard A. Schumacher, Dallas, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 81 days.

(21) Appl. No.: 14/090,073

(22) Filed: Nov. 26, 2013

(65) Prior Publication Data
US 2014/0203886 A1 Jul. 24, 2014

Related U.S. Application Data

(60) Provisional application No. 61/755,581, filed on Jan. 23, 2013.

(51) Int. Cl.
*H01P 5/02* (2006.01)
*H01R 13/6473* (2011.01)
*H01R 13/6461* (2011.01)
*H01R 13/6466* (2011.01)
(Continued)

(52) U.S. Cl.
CPC ........ *H01R 13/6473* (2013.01); *H01R 13/6461* (2013.01); *H01R 13/6466* (2013.01);
(Continued)

(58) Field of Classification Search
CPC ........... H01R 13/6461; H01R 13/6466; H01R 13/6473
USPC .......................................................... 333/33
See application file for complete search history.

(56) References Cited

U.S. PATENT DOCUMENTS 5,310,363 A 5/1994 Brownell et al.
5,997,358 A 12/1999 Adriaenssens et al.
(Continued)

FOREIGN PATENT DOCUMENTS

EP 2 339 702 A1 6/2011
WO WO 99/56369 A1 11/1999

OTHER PUBLICATIONS

United Kingdom Search and Examination Report Corresponding to United Kingdom Patent Application No. 1400526.8; Dated: Jul. 11, 2014; 7 Pages.

*Primary Examiner* — Stephen E Jones
*Assistant Examiner* — Scott S Outten
(74) *Attorney, Agent, or Firm* — Myers Bigel Sibley & Sajovec, P.A.

(57) ABSTRACT

Communications plugs are provided that include a housing that receives the conductors of the communication cable. A printed circuit board is mounted at least partially within the housing. A plurality of plug contacts are on the printed circuit board, and the printed circuit board includes a plurality of conductive paths that electrically connect respective ones of the conductors to respective ones of the plug contacts. First and second of the conductive paths are arranged as a first differential pair of conductive paths that comprise a portion of a first differential transmission line through the communications plug, where the first differential transmission line includes a first transition region where the impedance of the first differential transmission line changes by at least 20% and a second transition region impedance of the first differential transmission line changes by at least 20%.

12 Claims, 17 Drawing Sheets

(51) Int. Cl.
*H01R 24/64* (2011.01)
*H05K 1/02* (2006.01)
*H05K 1/11* (2006.01)

(52) U.S. Cl.
CPC .............. *H05K1/0228* (2013.01); *H01R 24/64* (2013.01); *H05K 1/024* (2013.01); *H05K 1/0219* (2013.01); *H05K 1/0245* (2013.01); *H05K 1/117* (2013.01); *H05K 2201/0187* (2013.01); *H05K 2201/0191* (2013.01); *H05K 2201/09672* (2013.01); *H05K 2201/09727* (2013.01); *H05K 2201/09781* (2013.01); *H05K 2201/1034* (2013.01); *H05K 2201/10356* (2013.01)

(56) References Cited

U.S. PATENT DOCUMENTS

| | | |
|---|---|---|
| 7,264,516 B2 | 9/2007 | Hashim et al. |
| 7,326,089 B2 | 2/2008 | Hashim |
| 7,402,085 B2 | 7/2008 | Hammond, Jr. et al. |
| 7,604,515 B2 | 10/2009 | Siemon et al. |
| 7,787,615 B2 | 8/2010 | Hammond, Jr. et al. |
| 7,857,635 B2 | 12/2010 | Goodrich et al. |
| 8,403,709 B2 | 3/2013 | Hammond, Jr. et al. |
| 2012/0040539 A1 | 2/2012 | Enge et al. |
| 2014/0227911 A1* | 8/2014 | Lim et al. ............ 439/660 |

* cited by examiner

United States Patent US 9,209,569 B2

COMMUNICATIONS CONNECTORS INCLUDING TRANSMISSION LINES HAVING IMPEDANCE DISCONTINUITIES THAT IMPROVE RETURN LOSS AND/OR INSERTION LOSS PERFORMANCE AND RELATED METHODS

CROSS REFERENCE TO RELATED APPLICATION

The present application claims priority under 35 U.S.C. §119 to U.S. Provisional Application Ser. No. 61/755,581, filed Jan. 23, 2013, the entire content of which is incorporated herein in its entirety as if set forth fully herein.

FIELD OF THE INVENTION

The present invention relates generally to communications connectors and, more particularly, to communications connectors such as modular plugs that may exhibit improved return loss and/or insertion loss performance.

BACKGROUND

Many hardwired communications systems use plug and jack connectors to connect a communications cable to another communications cable or to a piece of equipment such as a computer, printer, server, switch or patch panel. By way of example, high speed communications systems routinely use such plug and jack connectors to connect computers, printers and other devices to local area networks and/or to external networks such as the Internet. FIG. 1 depicts a highly simplified example of such a hardwired high speed communications system that illustrates how plug and jack connectors may be used to interconnect a computer 11 to, for example, a network server 20.

As shown in FIG. 1, the computer 11 is connected by a cable 12 to a communications jack 15 that is mounted in a wall plate 19. The cable 12 is a patch cord that includes a communications plug 13, 14 at each end thereof. Typically, the cable 12 includes eight insulated conductors. As shown in FIG. 1, plug 14 is inserted into an opening or "plug aperture" 16 in the front side of the communications jack 15 so that the contacts or "plug blades" of communications plug 14 mate with respective contacts of the communications jack 15. If the cable 12 includes eight conductors, the communications plug 14 and the communications jack 15 will typically each have eight contacts. The communications jack 15 includes a wire connection assembly 17 at the back end thereof that receives a plurality of conductors (e.g., eight) from a second cable 18 that are individually pressed into slots in the wire connection assembly 17 to establish mechanical and electrical connections between each conductor of the second cable 18 and a respective one of a plurality of conductive paths through the communications jack 15. The other end of the second cable 18 is connected to a network server 20 which may be located, for example, in a telecommunications closet of a commercial office building. Communications plug 13 similarly is inserted into the plug aperture of a second communications jack (not pictured in FIG. 1) that is provided in the back of the computer 11. Thus, the patch cord 12, the cable 18 and the communications jack 15 provide a plurality of electrical paths between the computer 11 and the network server 20. These electrical paths may be used to communicate electrical information signals between the computer 11 and the network server 20.

When signals are transmitted over a conductor (e.g., an insulated copper wire) in a communications cable, electrical noise from external sources may be picked up by the conductor, degrading the quality of the signal. In order to counteract such noise sources, the information signals in the above-described communications systems are typically transmitted between devices over a pair of conductors (hereinafter a "differential pair" or simply a "pair") rather than over a single conductor. The two conductors of each differential pair are twisted tightly together in the communications cables and patch cords so that the eight conductors are arranged as four twisted differential pairs of conductors. The signals transmitted on each conductor of a differential pair have equal magnitudes, but opposite phases, and the information signal is embedded as the voltage difference between the signals carried on the two conductors of the pair. When the signal is transmitted over a twisted differential pair of conductors, each conductor in the differential pair often picks up approximately the same amount of noise from these external sources. Because approximately an equal amount of noise is added to the signals carried by both conductors of the twisted differential pair, the information signal is typically not disturbed, as the information signal is extracted by taking the difference of the signals carried on the two conductors of the differential pair, and this subtraction process may mostly cancel out the noise signal.

Referring again to FIG. 1, it can be seen that a series of plugs, jacks and cable segments connect the computer 11 to the server 20. Each plug, jack and cable segment includes four differential pairs, and thus a total of four differential transmission lines are provided between the computer 11 and the server 20 that may be used to carry two way communications therebetween (e.g., two of the differential pairs may be used to carry signals from the computer 11 to the server 20, while the other two may be used to carry signals from the server 20 to the computer 11). Unfortunately, the proximities of the conductors and contacting structures within each plug jack connection (e.g., where plug 14 mates with jack 15) can produce capacitive and/or inductive couplings. These capacitive and inductive couplings in the connectors (and similar couplings that may arise in the cabling) give rise to another type of noise that is known as "crosstalk."

In particular, "crosstalk" refers to unwanted signal energy that is capacitively and/or inductively coupled onto the conductors of a first "victim" differential pair from a signal that is transmitted over a second "disturbing" differential pair. The induced crosstalk may include both near-end crosstalk (NEXT), which is the crosstalk measured at an input location corresponding to a source at the same location (i.e., crosstalk whose induced voltage signal travels in an opposite direction to that of an originating, disturbing signal in a different path), and far-end crosstalk (FEXT), which is the crosstalk measured at the output location corresponding to a source at the input location (i.e., crosstalk whose signal travels in the same direction as the disturbing signal in the different path). Both types of crosstalk comprise an undesirable noise signal that interferes with the information signal that is transmitted over the victim differential pair.

While methods are available that can significantly reduce the effects of crosstalk within communications cable segments, the communications connector configurations that were adopted years ago—and which still are in effect in order to maintain backwards compatibility—generally did not maintain the arrangement and geometry of the conductors of each differential pair so as to minimize the crosstalk coupling between the differential pairs in the connector hardware. For example, pursuant to the ANSI/TIA-568-C.2 standard approved Aug. 11, 2009 by the Telecommunications Industry Association (also known as the Category 6a standard), in the connection region where the blades of a modular plug mate with the contacts of the modular jack (referred to herein as the "plug-jack mating region"), the eight conductors 1-8 must be aligned in a row, with the eight conductors 1-8 arranged as four differential pairs specified as depicted in FIG. 2. As is apparent from FIG. 2, this arrangement of the eight conductors 1-8 will result in unequal coupling between the differential pairs, and hence both NEXT and FEXT is introduced in each connector in industry standardized communications systems.

As the operating frequencies of communications systems has increased, crosstalk in the plug and jack connectors has became a more significant problem. To address this problem, communications jacks now routinely include compensating crosstalk circuits that introduce compensating crosstalk that was used to cancel much of the "offending" crosstalk that is introduced in the plug-jack mating region as a result of the industry-standardized connector configurations. Initially, so-called "single-stage" crosstalk compensation circuits were developed that could cancel the "offending" crosstalk that is generated in a plug-jack connector because a first conductor of a first differential pair couples more heavily with a first of the two conductors of a second differential pair than does the second conductor of the first differential pair. Typically, these single-stage crosstalk compensation circuits were implemented by configuring the jack so that the second conductor of the first differential pair would couple with the first of the two conductors of the second differential pair later in the jack to provide a "compensating" crosstalk signal. As the first and second conductors of the differential pair carry equal magnitude, but opposite phase signals, so long as the magnitude of the "compensating" crosstalk signal that is induced in such a fashion is equal to the magnitude of the "offending" crosstalk signal, then the compensating crosstalk signal that is introduced later in the jack may substantially cancel out the offending crosstalk signal.

While the above-described "single-stage" crosstalk compensation circuits were generally effective at cancelling out most of the crosstalk for low frequency signals (e.g., below 100 MHz), as the industry moved to higher frequency signals the phase change between the offending crosstalk signal and the compensating crosstalk signal became more significant such that it became difficult to achieve sufficient crosstalk compensation. Consequently, the use of "multi-stage" crosstalk compensation schemes became common. Such crosstalk schemes are described in U.S. Pat. No. 5,997,358 to Adriaenssens et al., the entire content of which is hereby incorporated herein by reference as if set forth fully herein.

Work is now ongoing in the industry to develop a Category 8 standard that will specify parameters for higher data rate communications plugs, jacks and cable segments that may operate at higher frequencies. For example, the above-referenced ANSI/TIA-568-C.2 Category 6a standard provides for communications at frequencies up to 500 MHz. In contrast, it is anticipated that the Category 8 standard may call for communications at frequencies up to, for example, 2 GHz. Moreover, it is anticipated that Category 8 connectors (e.g., plug and jacks) may be required to exhibit full backwards compatibility so that they may be used with conventional Category 6 or 6a connectors while meeting the component and channel performance requirements set forth in the Category 6 and 6a standards. Special challenges may be involved in providing communications connectors that can meet the Category 8 performance standards over the full anticipated Category 8 frequency range while also providing full backwards compatibility.

SUMMARY

Pursuant to embodiments of the present invention, patch cords are provided that include a communications cable that has at least a first conductor, a second conductor, a third conductor and a fourth conductor. A plug is attached to a first end of the communications cable. This plug includes a housing that receives the communications cable and first through fourth plug contacts that are at least partially within the housing. First through fourth conductive paths connect respective ones of the conductors to respective ones of the plug contacts. The first and second conductors, the first and second conductive paths, and the first and second plug contacts form a first differential transmission line through the plug, and the third and fourth conductors, the third and fourth conductive paths, and the third and fourth plug contacts form a second differential transmission line through the plug. The first differential transmission line includes at least a first segment having a first impedance, a second segment having a second impedance, and a third segment having a third impedance, where the second segment is between the first and third segments, and where the first impedance is different than the second impedance and the second impedance is different than the third impedance. The first, second and third impedances and the electrical lengths of the first, second and third sections are selected to provide a desired return loss spectrum for the first differential transmission line.

In some embodiments, the local maximum in the return loss spectra of the first differential transmission line may be positioned within the return loss spectra in order to extend the operating frequency range of the patch cord over which a minimum return loss margin may be maintained. IN some embodiments, the local maximum in the return loss spectra of the first differential transmission line may be within a pre-selected frequency range of an operating frequency range of the patch cord. or may be at a frequency that is outside the operating frequency range of the patch cord but that is no more that 50% higher than the highest frequency in the operating frequency range of the patch cord.

In some embodiments, the first through fourth conductive paths each traverse a printed circuit board, and the first segment of the first differential transmission line connects to the second segment of the first differential transmission line on the printed circuit board. The second segment of the first differential transmission line may connect to the third segment of the first differential transmission line on the printed circuit board. A first pair of conductive trace sections on the printed circuit board that form the first segment of the first differential transmission line may have widths and/or thicknesses that are different than the corresponding widths and/or thicknesses of a second pair of conductive trace sections on the printed circuit board that form the second segment of the first differential transmission line.

In some embodiments, the local maximum in the return loss spectra of the first differential transmission line is between a frequency of 1 GHz and a frequency of 5 GHz. The plug may be an RJ-45 plug. The impedance of the first segment of the first differential transmission line may differ from the impedance of the second segment of the first differential transmission line by at least 20 percent, and the impedance of the second segment of the first differential transmission line may differ from the impedance of the third segment of the first differential transmission line by at least 20 percent.

Pursuant to further embodiments of the present invention, communications plugs are provided that include a housing that receives the conductors of the communication cable. A printed circuit board is mounted at least partially within the housing. A plurality of plug contacts are on the printed circuit board, and the printed circuit board includes a plurality of conductive paths that electrically connect respective ones of the conductors to respective ones of the plug contacts. First and second of the conductive paths are arranged as a first differential pair of conductive paths that comprise a portion of a first differential transmission line through the communications plug, where the first differential transmission line includes a first transition region where the impedance of the first differential transmission line changes by at least 20%.

In some embodiments, the first differential transmission line may include a second transition region where the impedance of the first differential transmission line changes by at least 20%. The magnitude of the impedance change at the first transition region and the magnitude of the impedance change at the second transition region may be selected to improve the return loss of the first differential transmission line in the frequency range of 1 GHz to 2 GHz. The impedance change at the first transition region may be created at least in part by varying the widths, thicknesses and/or the spacing of the conductors used to form the first differential transmission line adjacent the first transition region, by varying the distance(s) of the conductors from adjacent image planes, if any, by varying the dielectric constants of the surrounding materials, by adding one or more capacitances to one or both members of the differential transmission line, and/or by adding one or more inductances in series with one or both members of the differential transmission line. The return loss spectra of the first transmission line may include a local maximum at a frequency above 500 MHz.

Pursuant to further embodiments of the present invention, methods of improving the return loss on a differential transmission line through a communications connector are provided in which the differential transmission line is divided into at least a first segment, a second segment and a third segment, wherein a first impedance mismatch between the impedances of the first and second segments differs by at least 20%, and a second impedance mismatch between the impedances of the second and third segments differs by at least 20%.

DETAILED DESCRIPTION

Pursuant to embodiments of the present invention, communications connectors such as communications plugs are provided that may meet crosstalk as well as return loss and insertion loss performance requirements.

Figure 1:
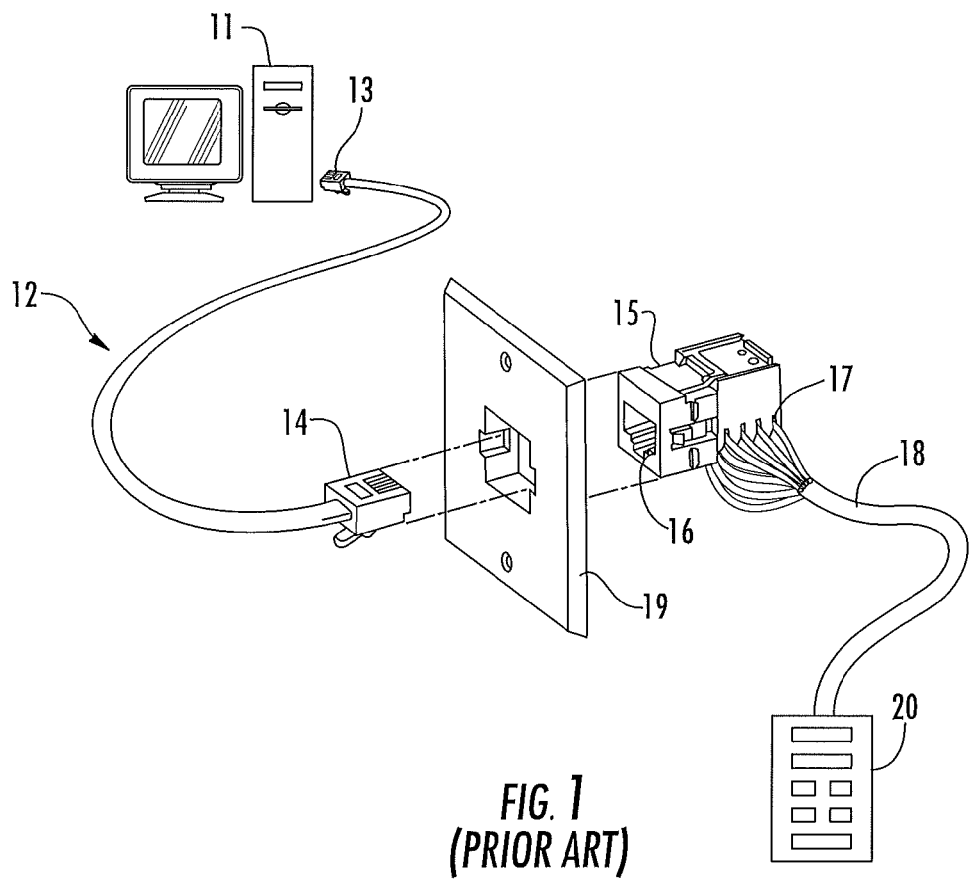
FIG. 1 is a simplified schematic diagram illustrating the use of conventional communications plugs and jacks to interconnect a computer with network equipment.
Figure 2:
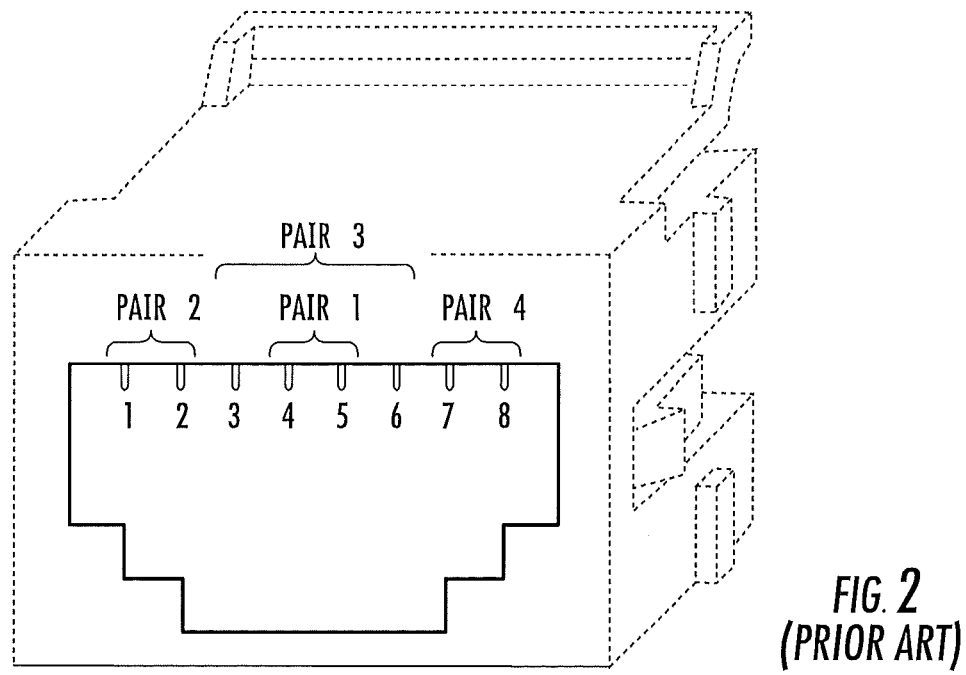
FIG. 2 is a schematic diagram illustrating the modular jack contact wiring assignments for a conventional 8-position communications jack (TIA 568B) as viewed from the front opening of the jack.

As noted above, in communications connectors that include multiple differential pairs, crosstalk is an important performance parameter that impacts the throughput (data rate) that the connector can accommodate. Another important parameter in communications connectors is the return loss that is experienced along each differential pair (i.e., differential transmission line) through the connector. The return loss of a transmission line is a measure of how well the transmission line is impedance matched with a terminating device or with loads that are inserted along the transmission line. In particular, the return loss is a measure of the signal power that is lost due to signal reflections that may occur at discontinuities (impedance mismatches) in the transmission line. Return loss is typically expressed as a ratio in decibels (dB) as follows:

$$RL(\text{dB}) = 10\log_{10}\frac{P_i}{P_r}$$

where RL(dB) is the return loss in dB, $P_i$ is the incident power and $P_r$ is the reflected power. High return loss values indicate a good impedance match (i.e., little signal loss due to reflection), which results in lower insertion loss values, which is desirable. The industry standards will typically specify minimum return loss requirements for the transmission lines within individual connectors, within mated connectors (i.e., across a mated plug and jack) and/or for an entire communications channel (i.e., for one or more differential transmission lines that extend from computer 11 to server 20 in FIG. 1 across various connectors and cable segments). As return loss typically decreases with increasing frequency (i.e., the return loss performance gets worse with increasing frequency), the industry standards typically specify minimum return loss values that must be met as a function of frequency for the specified components and/or channels.

In communications systems that include multiple differential transmission lines, it is commonplace for inductive and capacitive couplings to exist between various of the transmission lines. For example, as discussed above, offending crosstalk and compensating crosstalk circuits are routinely provided in plug and jack connectors. Unfortunately, these inductive and capacitive couplings appear as loads along the transmission line that can degrade the return loss of the transmission line.

By way of example, the Category 6 and 6a standards require that standards-compliant communications plugs introduce predetermined amounts of "offending" crosstalk between the four differential pairs thereof. If the Category 8 standard requires backwards compatibility with the Category 6 and 6a standards, then it will be necessary for Category 8 standards-compliant plugs to inject the industry-standardized amounts of offending crosstalk between the four differential transmission lines as well. However, this "offending" crosstalk will appear as loads on each of the differential transmission lines through the plug. Moreover, in order to comply with the crosstalk requirements set forth in the Category 6a standard, it will likely also be necessary to include crosstalk compensation circuits in the Category 8 communications jacks that substantially cancel the offending crosstalk that is generated in the plug. This compensating crosstalk thus will also appear as loads on the four differential transmission lines that pass through the mated plug-jack connectors. It is anticipated that it may be difficult to maintain acceptable return loss performance at higher frequencies (e.g., frequencies above 1 GHz) in a communications plug (or mated plug-jack combination) while also injecting the necessary amount of offending crosstalk between the differential pairs and compensating for the same in the communications jack.

Pursuant to embodiments of the present invention, communications connectors are provided that have signal paths that include one more electrical circuits that create resonances at one or more frequencies. These resonances (including the frequency range over which the resonances occur) may be tuned to enhance the return loss and/or the insertion loss of the signal path within a desired range of frequencies without unacceptably degrading other characteristics of the signal path. The resonant frequencies are not necessarily within the range of frequencies within which return loss and/or insertion loss is enhanced. In fact, in some embodiments the resonance may be so wide that it does not create a peak or local maximum in either the return loss or insertion loss spectra of the signal path. The electrical circuits that generate the resonances can be implemented using, for example, discrete capacitors and inductors and/or using a transmission line containing at least two impedance discontinuities of particular magnitudes separated by a particular electrical length.

In some embodiments, communications connectors are provided that have at least one transmission line that includes pre-selected impedance mismatches that are used to improve the return loss and/or the insertion loss of the transmission line over a desired frequency range. In particular, the transmission line may include at least two locations where impedance mismatches are provided that create resonances. The magnitude of these impedance mismatches and the locations of the impedance mismatches (which determines the time delay between the impedance mismatches and other elements along the transmission line) may be selected to improve the return loss and/or the insertion loss of the transmission line over a selected frequency range such as, for example, from about 1 GHz to about 2 GHz. These designed impedance mismatches and associated delay(s) may create resonances or other effects, including large amounts of signal reflections, at frequency ranges outside of the frequency range of interest. The resonances may be tuned by adjusting the magnitudes of the impedance mismatches and the electrical delays between the impedance mismatches. In some cases, the resonances may create a local maximum in the return loss spectra and/or a local minimum in the insertion loss spectra for the transmission line. These local maxima and minima may (but need not be) within or just outside the frequency range for which the transmission line is designed to operate and may be used to effectively extend the frequency range (to higher frequencies) over which the transmission line may provide suitable return loss performance.

In some embodiments, the connector may be a communications plug. The plug may be designed to have at least two impedance mismatches along at least one of the differential transmission lines through the plug. These impedance mismatches can be implemented in a wide variety of ways. For example, in plugs in which at least part of the transmission lines run across (and perhaps through) a printed circuit board, one or more impedance mismatches may be created by, for example, (1) changing the width, thickness or spacing of the conductive traces/elements on the printed circuit board that form the transmission line segments, (2) varying the distance(s) of the conductors from adjacent image planes, if any, and/or (3) by varying the dielectric constants of the surrounding materials. Impedance mismatches may also or alternatively be implemented at transitions within the plug such as the transition from conductive wires of a communications cable to printed circuit board conductive traces or from printed circuit board conductive traces to the blades of the plug. By carefully selecting the magnitude of these impedance mismatches and the delays between the mismatches it is possible to significantly improve the return loss performance of the transmission line over a selected frequency range.

As noted above, in other embodiments, the time delayed impedance mismatches along the transmission line(s) of the communications connector may be replaced by discrete reactive elements such as capacitors and/or inductors. For example, on a balanced (differential) transmission line discrete reactive elements may be provided along the transmission line that resemble and/or function as a "box-section" filter (i.e., two shunt capacitors between the conductors of the transmission line with a series inductor along each conductor between the two capacitors). For connectors that use single-ended transmission lines, the discrete reactive elements may be arranged as a pi-section filter (i.e., two shunt capacitors with a series inductor therebetween). In still other embodiments, a combination of the time-delayed impedance mismatches and discrete reactive elements may be used to generate the resonances that are tuned to provide improved return loss and insertion loss performance.

In some embodiments, the connectors may comprise Category 8 standard plugs that include coupling components such as capacitors or inductive coupling sections that are used to increase the crosstalk between the differential transmission lines through the plug in order to comply with the offending crosstalk levels specified in the Category 6a standard. As noted above, such coupling components may be provided to ensure that the plug is backwards compatible with the Category 6a standard. In some embodiments, these crosstalk coupling components may be incorporated into the electrical circuit that is provided to improve return loss and/or insertion loss performance. In other embodiments, the connectors may comprise Category 6a plugs. It will also be appreciated that embodiments of the present invention are not limited to Ethernet connectors or to connectors with differential transmission lines. Additionally, while embodiments of the present invention are primarily discussed herein with respect to communications plugs, it will be appreciated that crosstalk compensation is routinely introduced in jacks and that the techniques that are described herein may also be used in jacks to improve the return loss and/or insertion loss performance thereof.

Embodiments of the present invention will now be discussed in greater detail with reference to the drawings.

Figure 3:
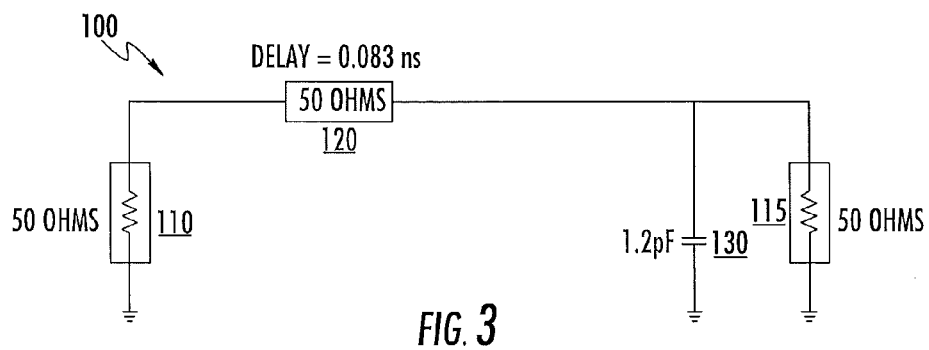
FIG. 3 is a circuit diagram of a model of a conventional differential transmission line through a communications plug.
Figure 4A:
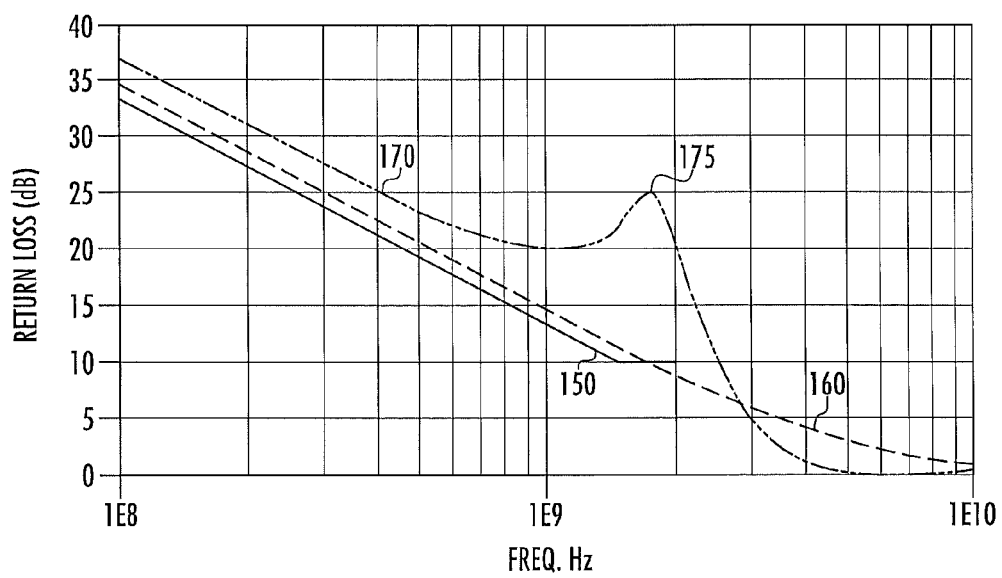
FIG. 4A is a graph illustrating the return loss of a first plug that does not use the return loss improvement techniques according to embodiments of the present invention and of a second plug that uses the return loss techniques according to embodiments of the present invention.
Figure 4B:
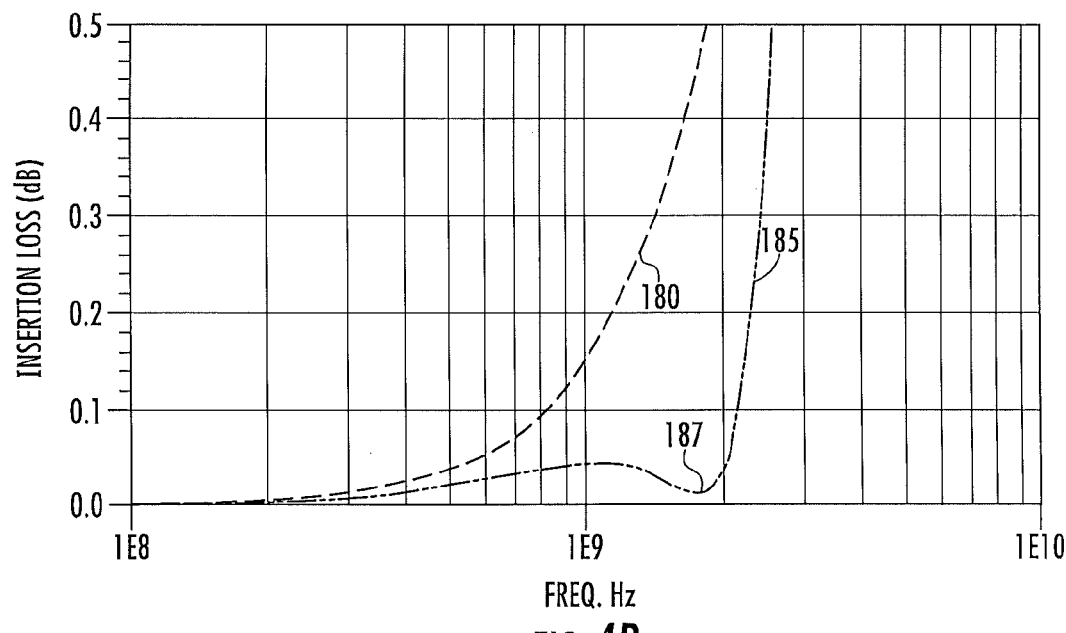
FIG. 4B is a graph illustrating the insertion loss of a first plug that does not use the return loss improvement techniques according to embodiments of the present invention and of a second plug that uses the return loss techniques according to embodiments of the present invention.

FIG. 3 is a simplified circuit model of a single-ended (i.e., non-differential) 50 ohm transmission line 100 that illustrates how crosstalk circuits (i.e., offending crosstalk or compensating crosstalk components, whether or not intentionally introduced) can create a load along a transmission line. FIG. 4A is a graph illustrating the modeled return loss of the transmission line 100 of FIG. 3 that illustrates how the transmission line 100 may fail to meet the proposed return loss parameter for the Category 8 standard at high frequencies. FIG. 4A also includes a graph illustrating the modeled return loss of a transmission line according to embodiments of the present invention that illustrates the degree to which return loss performance may readily be improved. This graph in FIG. 4A will be discussed below in conjunction with FIG. 5. FIG. 4B is a graph illustrating the modeled insertion loss of the transmission line 100 of FIG. 3 as compared to the modeled insertion loss of a transmission line according to embodiments of the present invention.

As shown in FIG. 3, the transmission line 100 may be modeled as a signal source with internal series termination 110, a transmission line segment 120, a capacitive load 130 and an end termination 115. Each of the terminations 110, 115 are 50 ohm terminations, as is the transmission line segment 120. The transmission line segment 120 has a length that results in a delay of 0.083 nanoseconds (i.e., an RF signal will traverse each transmission line segment in 0.083 nanoseconds). The capacitive load 130 is assumed to be a shunt 1.2 pF capacitance, which is representative of the type of capacitive load that results from the offending crosstalk requirements in the Category 6a standard. While the crosstalk load 130 is modeled as solely comprising capacitive crosstalk, it will be appreciated that the pair-to-pair crosstalk in communications connectors will typically include both a capacitive component and an inductive component. The inductive component of the crosstalk may likewise appear as a load on the transmission line and have similar effects on return loss performance. The effect of the crosstalk is modeled in FIG. 3 as a purely capacitive effect in order to simplify the example and associated modeling.

Referring now to FIG. 4A, one proposed return loss specification for a transmission line through a Category 8 plug is shown as curve 150. As shown in FIG. 4A, a return loss of at least 33 dB is specified at 100 MHz and this minimum return loss requirement drops to about 10 dB at 1.5 GHz, where it remains constant. As is also shown in FIG. 4, the return loss performance of the transmission line 100 of FIG. 3 (curve 160) has a margin of about 1 dB for frequencies below 1.5 GHz, but at frequencies above 1.7 GHz the return loss of the transmission line 100 falls below the proposed standard (curve 150). This degradation in return loss performance at higher frequencies may be attributable to the load imparted by the capacitor 130 on the transmission line 100. As the capacitive load 130 may be necessary to comply with industry standards requirements (e.g., interface specifications, crosstalk specifications), it may be difficult to meet return loss performance standards at higher frequencies, as shown in FIG. 4A.

Figure 5:
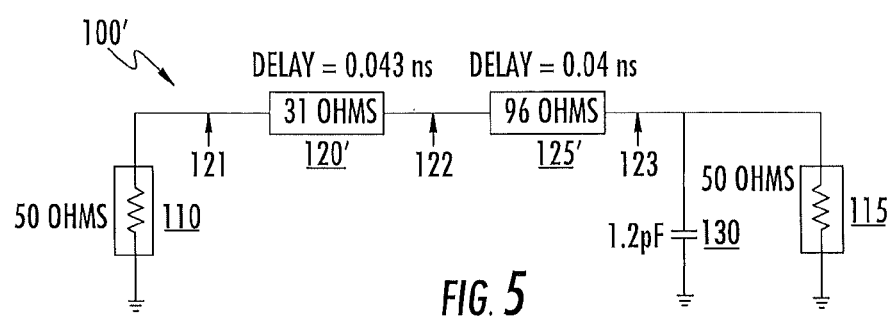
FIG. 5 is a circuit diagram of a model of a differential transmission line through a communications plug that includes impedance imbalances that improve return loss performance over a selected frequency band.

FIG. 5 illustrates how the techniques according to embodiments of the present invention may be used to improve the return loss of the transmission line 100 of FIG. 3 so that it meets the proposed Category 8 return loss standard with significant margin.

As shown in FIG. 5, the transmission line 100 of FIG. 3 may be replaced with a transmission line 100'. The transmission line 100' includes the same signal source with internal series termination 110, the same end termination 115 and the same capacitive load 130 that are included in the transmission line 100 of FIG. 3. However, the 50 ohm transmission line segment 120 of the transmission line 100 of FIG. 3 is replaced with a pair of transmission line segments 120' and 125'. The impedances of the transmission line segments 120' and 125' and the lengths of these transmission line segments are selected to create impedance mismatches that impact the return loss of transmission line 100' in a desired manner. In this example, the transmission line segment 120' has an impedance of 31 ohms, and a delay of 0.043 nanoseconds, and the transmission line segment 125' has an impedance of 96 ohms, and a delay of 0.04 nanoseconds. Thus, a first impedance mismatch 121 is generated at the interface between the termination 110 and the transmission line segment 120' (where a 50 ohm element and a 31 ohm element interface), a second impedance mismatch 122 is generated at the interface between the transmission line segment 120' and the transmission line segment 125' (where a 31 ohm element and a 96 ohm element interface), and a third impedance mismatch 123 is generated at the interface between the transmission line segment 125' and the end termination 115 (where a 96 ohm element and a 50 ohm element interface).

Referring again to FIG. 4A, the curve 170 illustrates the modeled return loss performance of the transmission line 100'. As shown in FIG. 4A, improved return loss is seen at all frequencies below 2.7 GHz, with the return loss performance dropping off more slowly at frequencies between 100 MHz and 1 GHz as compared to the return loss performance of transmission line 100 (curve 160), and then the return loss performance actually improving for frequencies between about 1 GHz and 1.8 GHz before trending downward again. While Applicant does not intend to be limited to any particular theory of operation, it is believed that the impedance mismatches at each of the interfaces 121-123 in the transmission line 100' may act like a low pass filter. This may, in some cases, generate a local peak or "maximum" in the return loss spectra (i.e., a plot of return loss as a function of frequency) as illustrated at reference numeral 175 in FIG. 4A. It will also be appreciated that while the simplest designs may have low-pass filter characteristics, other designs that more resemble high-pass filters, band-stop filters or band-pass filters may also be used. While the return loss may, in some cases, fall off rapidly on the high frequency side of the local peak 175, the provision of a local peak 175 in the return loss spectra may allow for significantly improved return loss performance within a frequency range of interest. For example, as shown in FIG. 4A, by designing the transmission line 100' so that the local peak 175 is positioned, for example, at a frequency that is in the upper portion of the frequency range of operation (here, below 2 GHz), excellent return loss performance may be achieved in many cases across the entire operating frequency band.

An ideal, unloaded signal path (not shown in the figures) may theoretically have essentially infinite return loss (i.e., no reflection or signal degradation whatsoever). As shown in FIG. 4A, the load imparted on the transmission line 100 by the load capacitor 130 degrades the return loss at all frequencies, and this degradation reaches unacceptable levels (for this particular standard) at frequencies just below 2 GHz. As is also shown in FIG. 4A, the resonance created by the impedance mismatches (see curve 170) can be tuned to enhance return loss performance, especially in the frequency range of about 1 GHz to about 2 GHz, where the crosstalk compensation circuits in a mated plug-jack connector would otherwise significantly degrade return loss performance. By designing the transmission line so that the resonances at least mostly occur at frequencies that are outside the frequency range of interest (i.e., the frequency range that the connector is designed to support communications over), these resonances do not unduly impact the performance of the transmission line. Moreover, as noted above, by varying the magnitude of the impedance mismatches, the number of impedance mismatches and/or the delay between the impedance mismatches it is possible in some embodiments to create local peaks in the return loss spectra within the frequency band of interest. The inclusion of such local peaks in the return loss spectra may be particularly effective in providing a transmission loss that has significantly improved return loss performance.

In some embodiments, the local maximum in the return loss spectra of the differential transmission line may be positioned within the return loss spectra in order to extend the operating frequency range of the patch cord over which a minimum return loss margin may be maintained. For example, the peak 175 is positioned near the upper end of the desired operating range (i.e., near 2 GHz) in order to improve the return loss margin at higher frequencies. In some embodiments, the peak may be positioned in the upper half of the desired frequency operation range (i.e., between 1 GHz and 2 GHz in the example of FIG. 4A). In other embodiments, the peak may be positioned at a somewhat frequency above the highest frequency in the desired frequency operation range. For example, the peak may be positioned at a frequency that is outside the desired frequency operating range but that is no more that 50% higher than the highest frequency in the desired frequency operation range (i.e., between 2 GHz and 3 GHz in the example of FIG. 4A).

Referring next to FIG. 4B, the curve 180 illustrates the modeled insertion loss performance of the transmission line 100 and the curve 185 illustrates the modeled insertion loss performance of the transmission line 100'. As shown in FIG. 4B, significant improvements in insertion loss may also be achieved by the techniques according to embodiments of the present invention. Similar to the return loss spectra of FIG. 4A, the techniques according to embodiments of the present invention may provide a local minimum in the insertion loss (identified by reference numeral 187 in FIG. 4B). In some embodiments, this local minimum may be positioned, for example, at a frequency that is in the upper portion of the frequency range of operation (here, below 2 GHz) in order to provide excellent insertion loss performance across the entire operating frequency band. As shown in FIG. 4B, insertion loss may be improved by 0.5 dB or more in certain frequency ranges.

Figure 6:
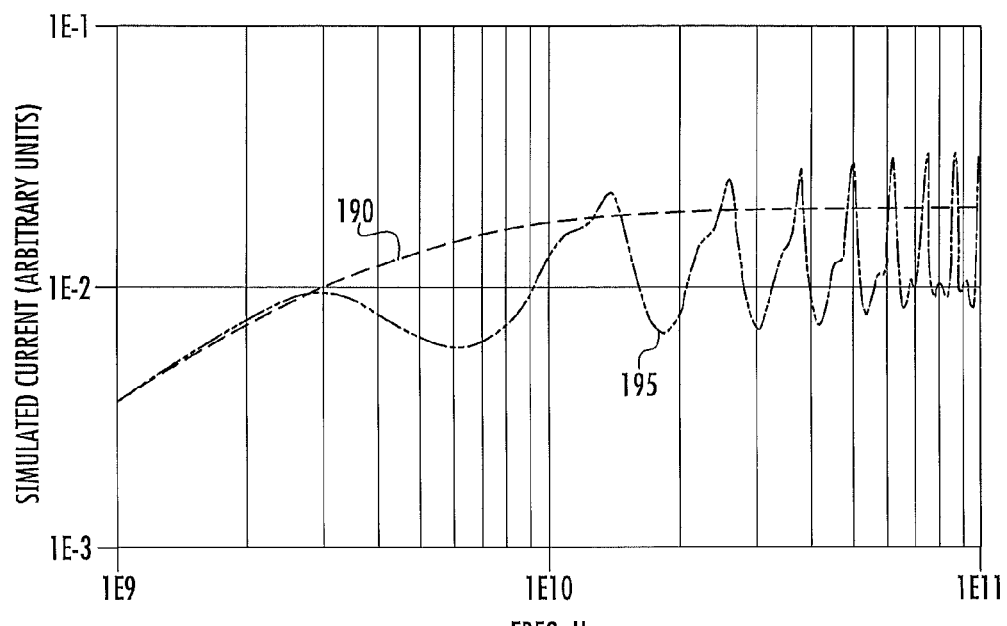
FIG. 6 is a graph that illustrates the currents into a load capacitor of the transmission line of FIG. 5 as a function of frequency.

FIG. 6 illustrates the modeled current flow in the transmission line 100' of FIG. 5. In particular, a current probe was included in the circuit model of FIG. 5 that measured the current flow, as a function of frequency, into the load capacitor 130. In FIG. 6, curve 190 is the simulated current flow into the load capacitor 130 in the transmission line 100 of FIG. 3, while curve 195 is the simulated current flow into the load capacitor 130 in the transmission line 100' of FIG. 5.

As shown in FIG. 6, no resonance is found in the current flow into the load capacitor 130 of the transmission line 100 (see curve 190). However, a resonance appears in the current flow into the load capacitor 130 in the transmission line 100' of FIG. 5 (see curve 195). This resonance is attributable to the impedance mismatch created by the load imparted on the transmission line 100' by the capacitor 130 together with the electrical length (time delay) of the intentionally added impedance mismatches and their associated time delays along the transmission line 100'. As shown in FIG. 6, the current into the load capacitor 130 may vary widely with frequency. In some embodiments, the transmission line 100' may be designed so that these resonances occur at frequencies that are outside the frequency range of interest (here frequencies above 2 GHz). This may facilitate ensuring that the resonances do not negatively affect the performance of the transmission line 100'. Moreover, by varying the magnitude of the impedance mismatches and/or the delay between these impedance mismatches it is possible to create one or more local peaks in the return loss spectra (see peak 175 in FIG. 4A) and/or one or more local minimums in the insertion loss spectra (see valley 187 in FIG. 4B) within or near the frequency band of interest, thereby providing a transmission line that may exhibit significantly improved return loss and/or insertion loss performance.

The impedance mismatches can be created in a wide variety of ways. As known to those of skill in the art, the impedance of a differential transmission line will be a function of, among other things, the shape of the conductors, the size of the conductors, the material used to form the conductors, the spacing between the conductors, the dielectric constants of the materials surrounding and between the conductors, etc. Thus, the above-described impedance mismatches may be implemented by changing any of these parameters. Trial and error or more deliberate modeling techniques may be used to identify impedance mismatches that provide a desired improvement in return loss performance over a selected frequency band.

For example, computer programs may be used to model the return loss (or insertion loss) of a transmission line through a plug that has one or more loads imparted thereon. The modeling may take into account not only the loads injected on the transmission line by crosstalk circuits and other closely-spaced transmission lines, but may also take into account impedance mismatches that will occur in transitions along the transmission line where, for example, a conductive wire connects to a printed circuit board trace, where insulation is removed from a conductive wire or where a conductive wire mates with a plug blade. One or more of the transmission line segments that extend between the loads may then be changed in the model to have a different impedance and/or a different length. A trial and error process may be used where the lengths and/or the size of the impedance mismatches are varied. The changes in return loss tend to be predictable as this trial and error process is carried out, so a circuit designer can readily identify impedance mismatches and transmission line segment lengths that will provide improved performance over a frequency range of interest. In other embodiments, this process could be automated using, for example, commercially available programs that find local maximum in an output parameter when a variety of input parameters are varied.

In some embodiments, the amount of the impedance mismatch may be at least about 20%. In other embodiments, the amount of the impedance mismatch may be at least about 30%. In still other embodiments, the amount of the impedance mismatch may be at least about 40%. Herein, where references are made to changes in impedance or to impedance mismatches that are specified using a percentage, the percentage is calculated by dividing the difference between the two impedances by the larger of the two impedances. For example, if a first transmission line segment having an impedance of 80 ohms connects to a second transmission line segment that has an impedance of 100 ohms, the change in impedance between these two transmission line segments or, equivalently, the degree of impedance mismatch, would be (100 ohms−80 ohms)/100 ohms=20%.

Figure 7:
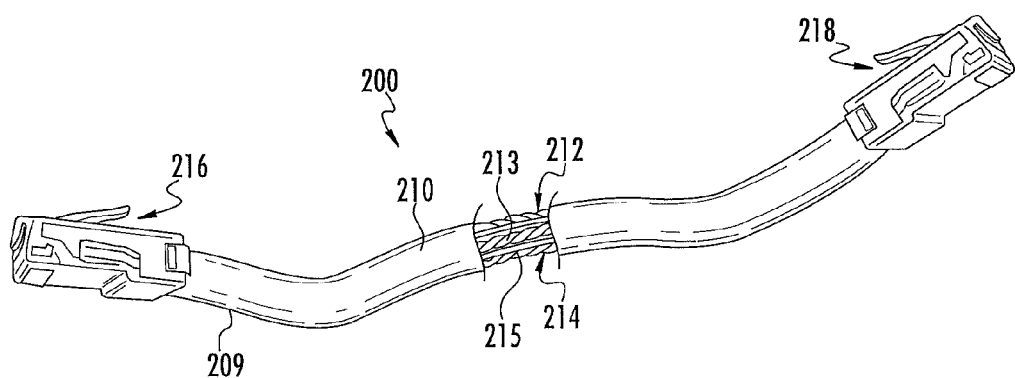
FIG. 7 is a perspective view of a patch cord according to certain embodiments of the present invention.
Figure 8:
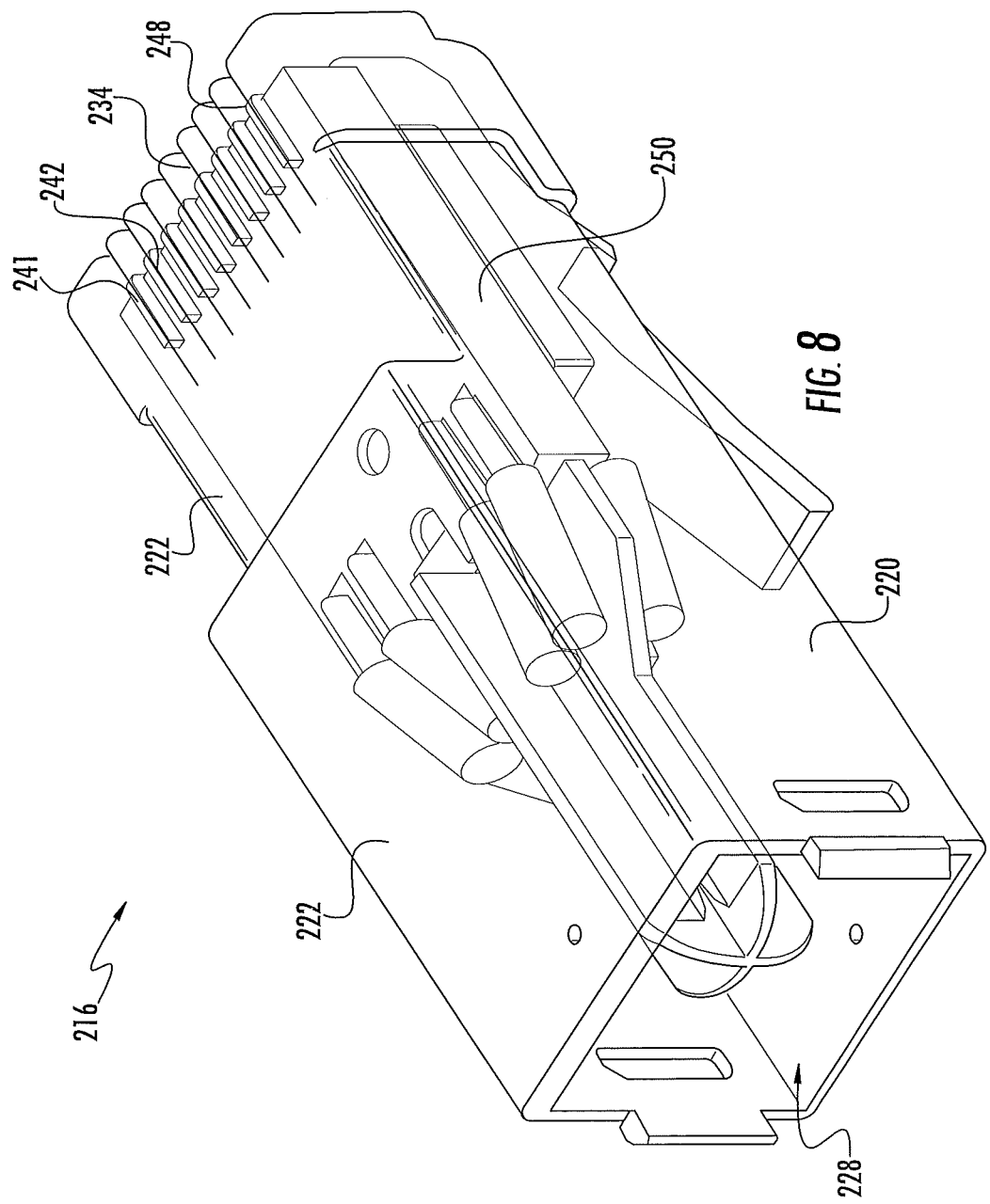
FIG. 8 is a top-rear perspective view of a plug that is included on the patch cord of FIG. 7.
Figure 9:
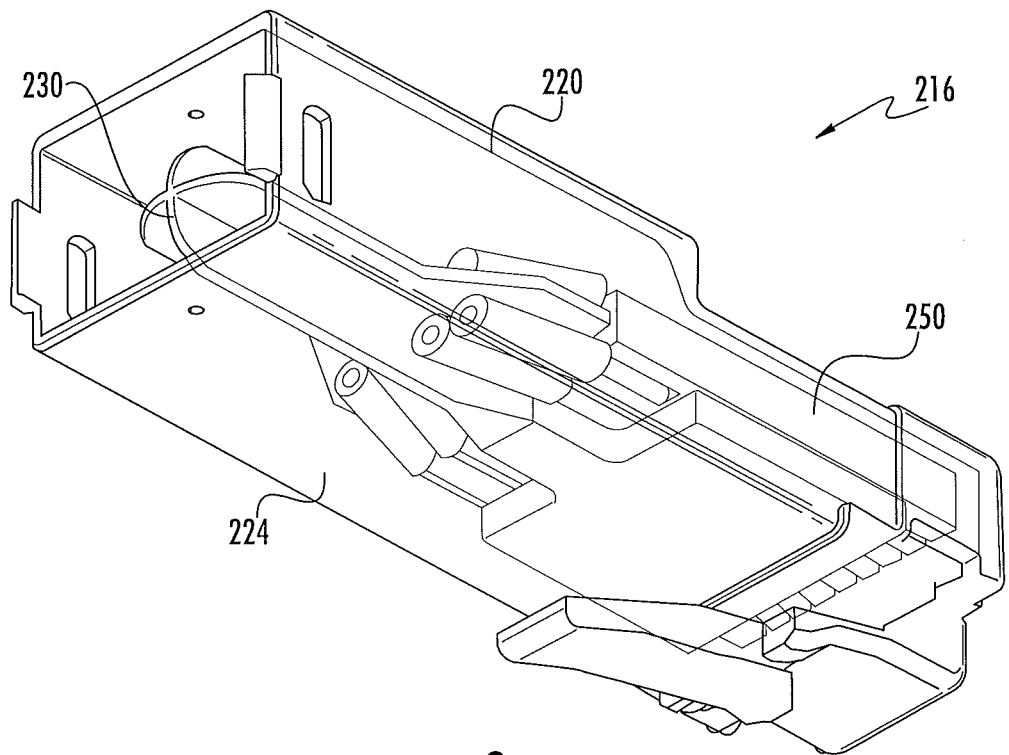
FIG. 9 is a bottom-rear perspective view of the plug of FIG. 8.
Figure 10:
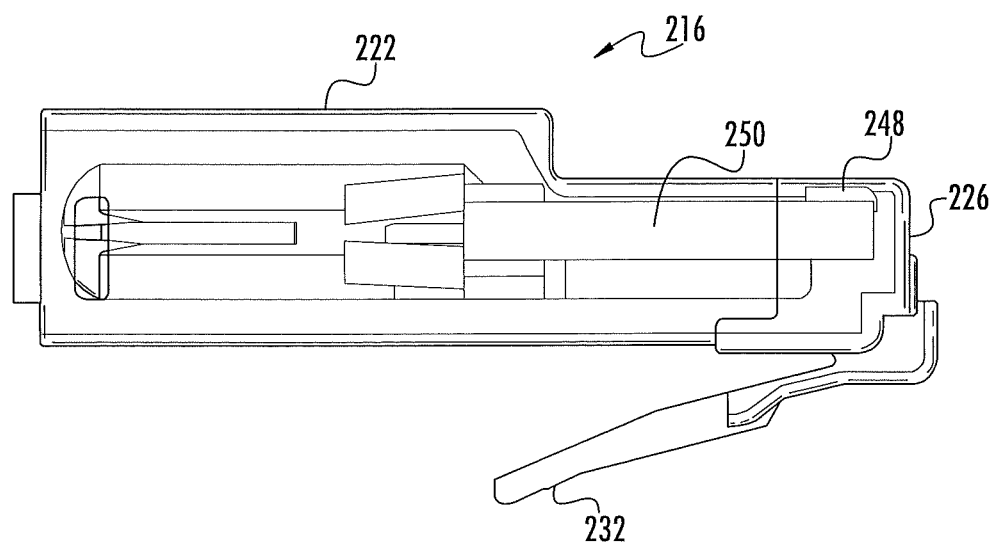
FIG. 10 is a side view of the plug of FIG. 8.

FIGS. 7-14 illustrate a patch cord 200 and various components thereof according to certain embodiments of the present invention. In particular, FIG. 7 is a perspective view of the patch cord 200. FIG. 8 is a top-rear perspective view of a plug 216 that is included on the patch cord 200 of FIG. 7. FIG. 9 is a bottom-rear perspective view of the plug 216. FIG. 10 is a side view of the plug 216. FIGS. 11-14 are various perspective views of a printed circuit board 250 of plug the 216 of FIGS. 7-10 that illustrate how the conductors 201-208 of the patch cord 200 connect to the plug blades 241-248 that are mounted on the printed circuit board 250.

As shown in FIG. 7, the patch cord 200 includes a cable 209 that has eight insulated conductors 201-208 enclosed in a jacket 210 (note that the conductors 201-208 are not individually numbered in FIG. 7, and conductors 204 and 205 are not visible in FIG. 7). The insulated conductors 201-208 may be arranged as four twisted pairs of conductors 211-214 (pair 211 is not visible in FIG. 7), with conductors 204 and 205 twisted together to form twisted pair 211, conductors 201 and 202 twisted together to form twisted pair 212, conductors 203 and 206 twisted together to form twisted pair 213, and conductors 207 and 208 twisted together to form twisted pair 214. A separator 215 such as a tape separator or a cruciform separator may be provided that separates one or more of the twisted pairs 211-214 from one or more of the other twisted pairs 211-214. A first plug 216 is attached to a first end of the cable 209 and a second plug 218 is attached to the second end of the cable 209 to form the patch cord 200. Strain relief boots (not shown in FIG. 7) may be attached to each of the plugs 216, 218 which resist the tendency for a longitudinal force applied to the cable 209 to pull the cable 209 out of the plugs 216, 218.

FIGS. 8-10 are enlarged views that illustrate the first plug 216 of the patch cord 200. In order to simplify the drawing, a rear cap of the plug housing, various wire grooming and wire retention mechanisms and the strain relief boot are not shown in FIGS. 8-10. As shown in FIGS. 8-10, the communications plug 216 includes a housing 220 that has a bi-level top face 222, a bottom face 224, a front face 226, and a rear opening 228 that receives a rear cap (not shown). A plug latch 232 extends from the bottom face 224. The top and front faces 222, 226 of the housing 220 include a plurality of longitudinally extending slots 234. The communications cable 209 (see FIG. 7) is received through the rear opening 228. A rear cap (not shown) that includes a cable aperture locks into place over the rear opening 228 of housing 220 after the communications cable 209 has been inserted therein.

As is also shown in FIGS. 8-10, the communications plug 216 further includes a printed circuit board 250 which is disposed within the housing 220, and a plurality of plug blades 241-248 are mounted at the forward edge of the printed circuit board 250 so that the blades 241-248 can be accessed through the slots 234 in the top face 222 and front face 226 of the housing 220. The housing 220 may be made of a suitable insulative plastic material that meets applicable standards with respect to, for example, electrical breakdown resistance and flammability such as, for example, polycarbonate, ABS, ABS/polycarbonate blend or other dielectric molded materials. Any conventional housing 220 may be used that is configured to hold the printed circuit board 250, and hence the housing 220 is not described in further detail herein.

Figure 11:
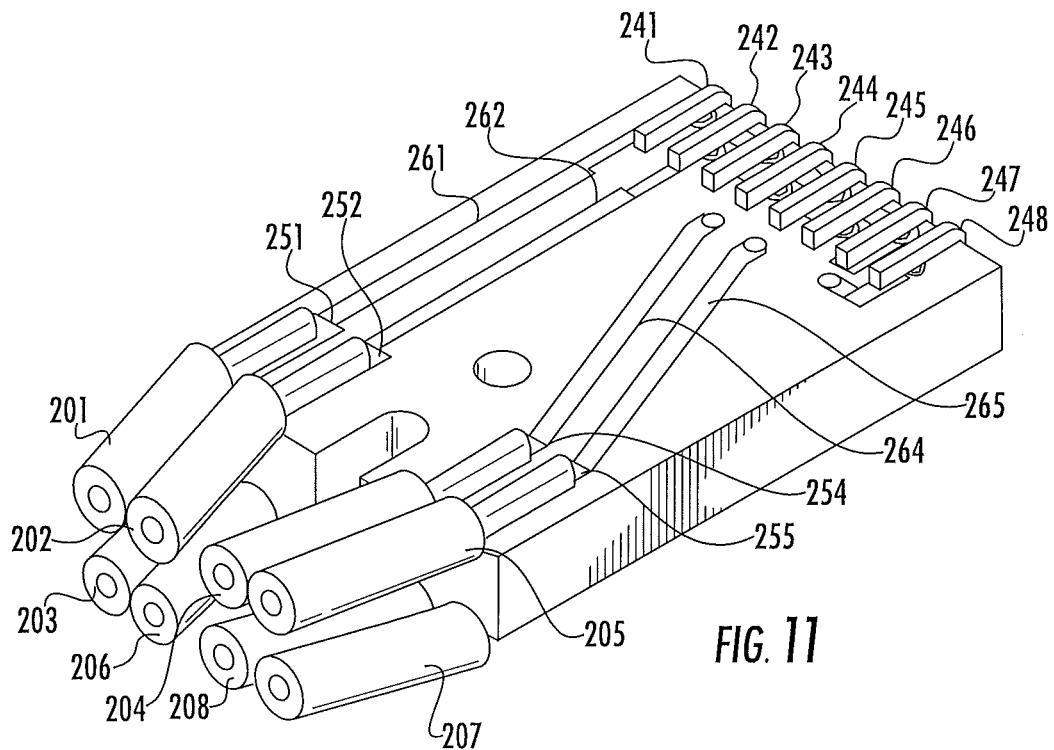
FIGS. 11-14 are various perspective views of a printed circuit board of the plug of FIGS. 7-10.
Figure 12:
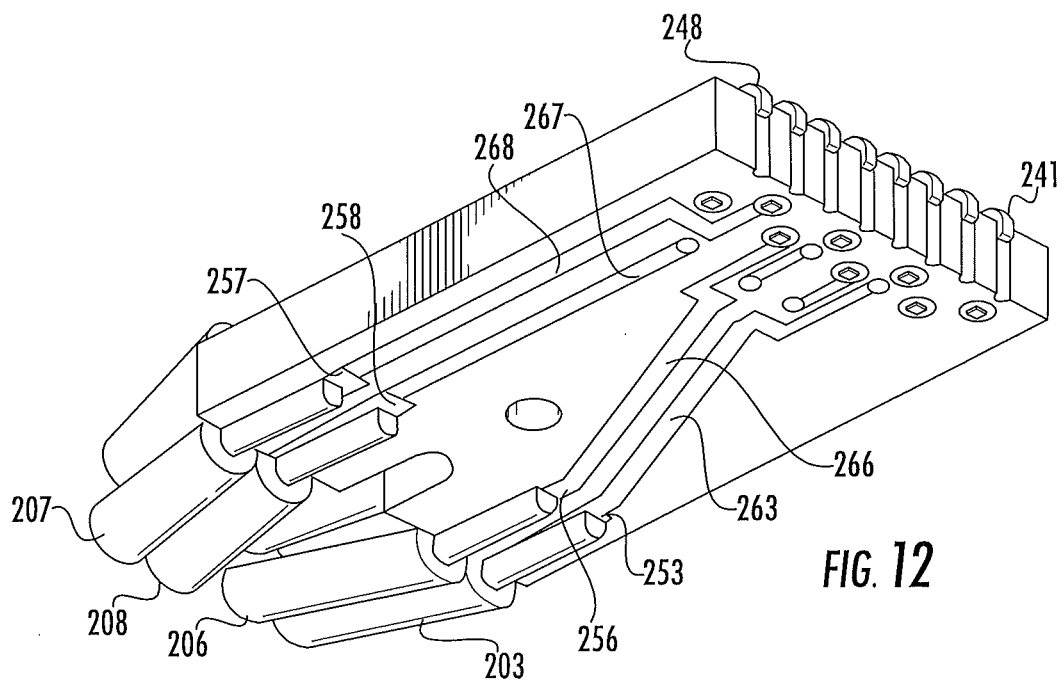
Figure 13:
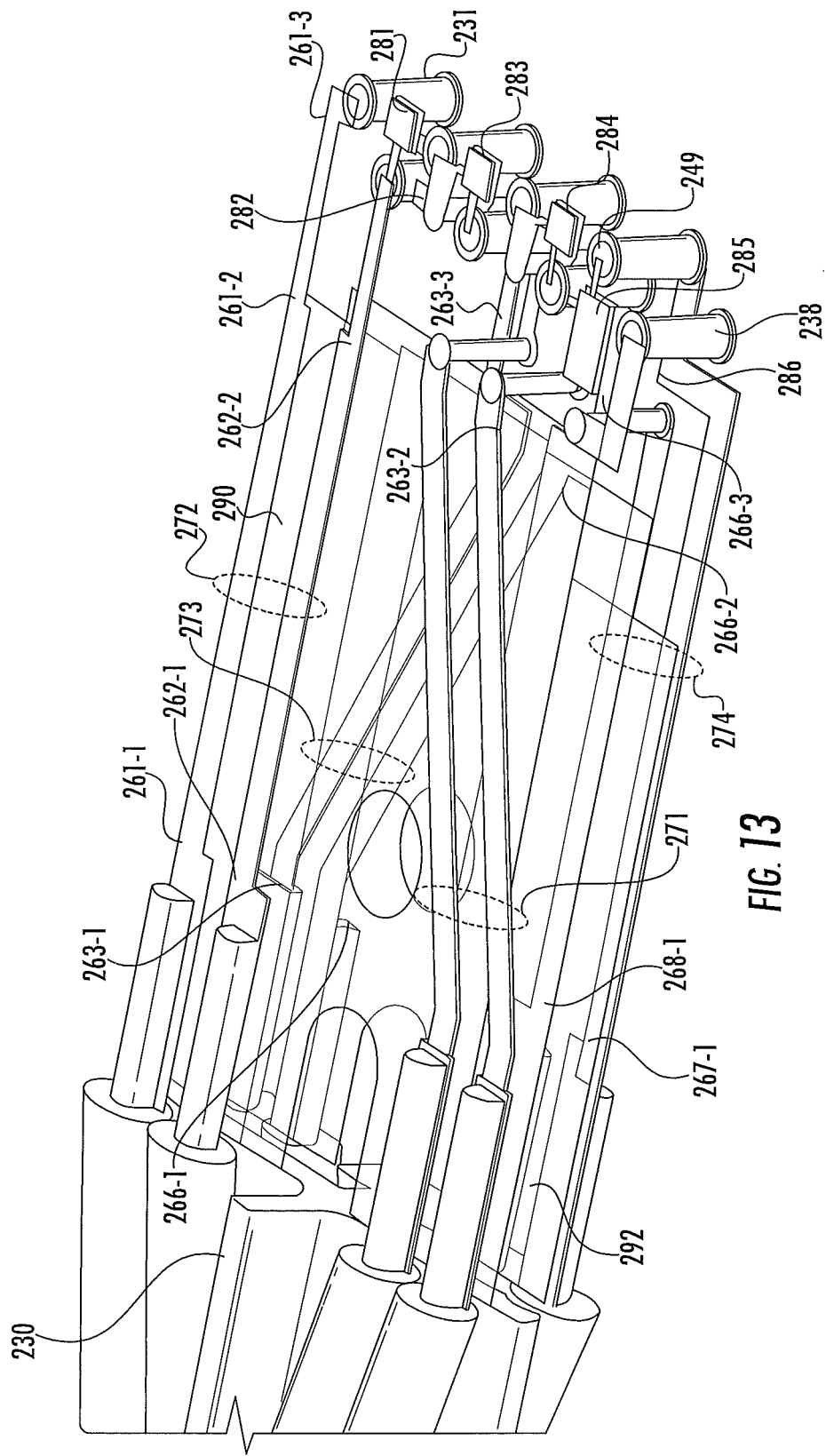
Figure 14:
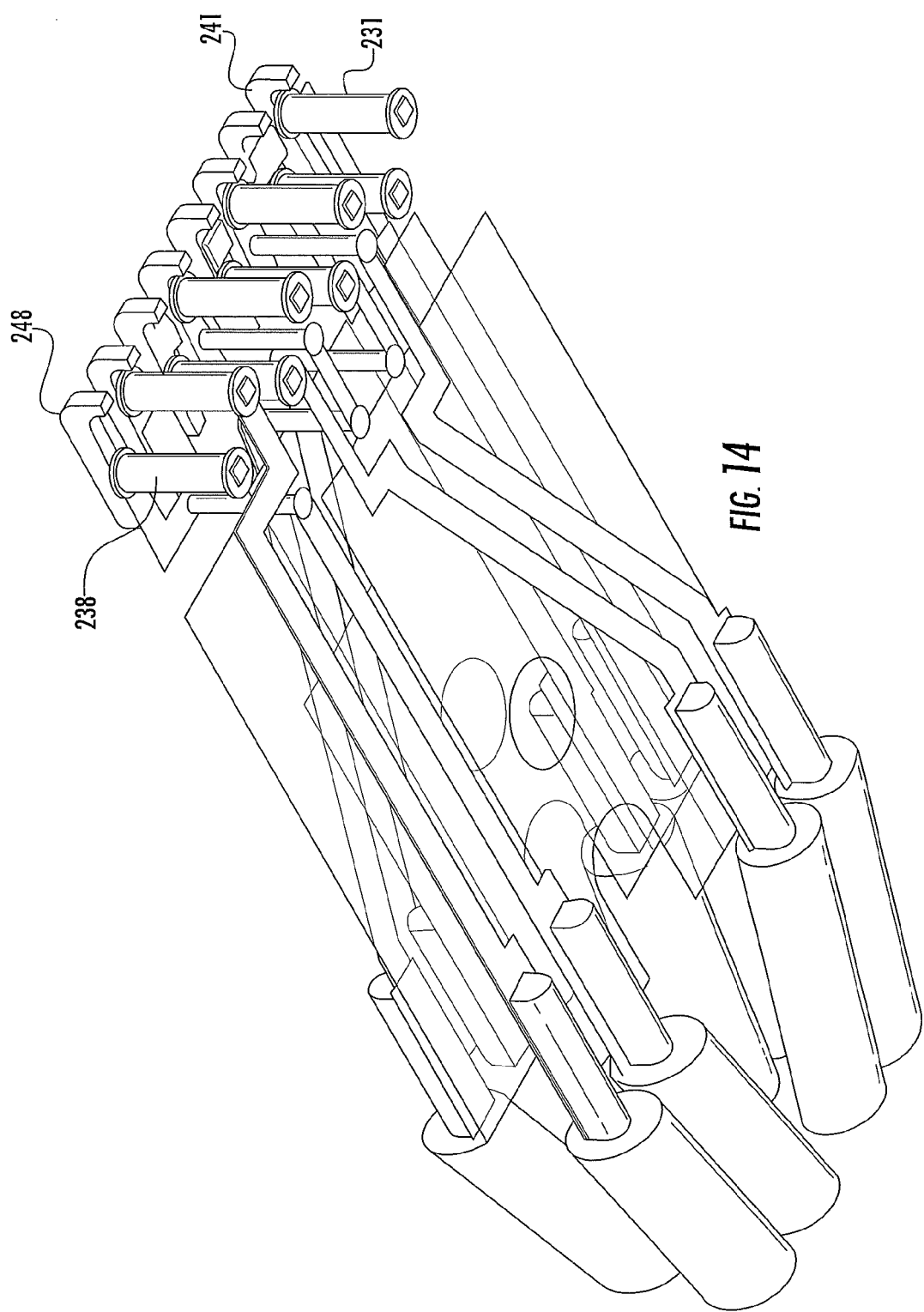

FIGS. 11 and 12 are enlarged perspective top and bottom views, respectively, of the printed circuit board 250 and the plug blades 241-248 that illustrate these structures in greater detail and that show how the insulated conductors 201-208 of communications cable 209 may be electrically connected to the respective plug blades 241-248 through the printed circuit board 250. FIGS. 13 and 14 are enlarged perspective top and bottom views, respectively, of the top and bottom surfaces of the printed circuit board 250 and the plug blades 241-248. In FIGS. 13 and 14, the dielectric portion of the printed circuit board 250 is omitted in order to better illustrate certain features of the printed circuit board 250. In FIG. 13, only the base portions of the plug blades 241-248 are shown in order to illustrate how the base portion of each plug blade 241-248 is received within a respective one of a plurality of metal-plated vias 231-238 in the printed circuit board 250 in order to mount the plug blades 241-248 on the printed circuit board 250.

The printed circuit board 250 may comprise, for example, a conventional printed circuit board, a specialized printed circuit board (e.g., a flexible printed circuit board) or any other appropriate type of wiring board. In the embodiment of the present invention depicted in FIGS. 8-14, the printed circuit board 250 comprises a conventional multi-layer printed circuit board.

As shown in the figures, the printed circuit board 250 includes four plated pads 251, 252, 254, 255 on a top surface thereof and an additional four plated pads 253, 256-258 on a bottom surface thereof. The insulation is removed from an end portion of each of the conductors 201-208 of the communications cable 209, and the metal (e.g., copper) core of each conductor 201-208 may be soldered, welded or otherwise attached to a respective one of the plated pads 251-258. By terminating each of the conductors 201-208 directly onto the plated pads 251-258 without the use of any insulation displacement contacts, insulation piercing contacts or other wire connection contacts, the size of the plug 216 may be reduced. It will also be appreciated that other techniques may be used for terminating the conductors 201-208 to the printed circuit board 250. For example, in other embodiments, a plurality of insulation piercing contacts or insulation displacement contacts may be mounted on the printed circuit board 250 that are used to electrically connect each conductor 201-208 to a respective trace on the printed circuit board 250. It will be appreciated that in other embodiments all of the conductors 201-208 may be mounted exclusively on the bottom surface of the printed circuit board 250 or exclusively on the top surface of the printed circuit board 250.

As is best shown in FIGS. 11-13, the conductors 201-208 may be maintained in pairs within the plug 216. A cruciform separator 230 may be included in the rear portion of the housing 220 that separates each pair 211-214 from the other pairs 211-214 in the cable 209 to reduce crosstalk in the plug 216. The conductors 201-208 of each pair 211-214 may be maintained as a twisted pair all of the way from the rear opening 228 of plug 216 up to the printed circuit board 250.

The plug blades 241-248 are configured to make mechanical and electrical contact with respective contacts, such as, for example, spring jackwire contacts, of a mating communications jack. In particular, as shown best in FIGS. 11-12 and 14, each of the eight plug blades 241-248 is mounted at the front portion of the printed circuit board 250. The plug blades 241-248 may be substantially transversely aligned in side-by-side relationship. Each of the plug blades 241-248 includes a first section that extends forwardly along a top surface of the printed circuit board 250, a transition section that curves through an angle of approximately ninety degrees and a second section that extends downwardly from the first section along a portion of the front edge of the printed circuit board 250. The transition section may include a curved outer radius that complies with the specification set forth in, for example, IEC 60603-7-4 for industry standards compliant plug blades.

Each of the plug blades 241-248 may be fabricated separately from the printed circuit board 250. In the depicted embodiment, each of the plug blades 241-248 comprise, for example, an elongated metal strip having a length of approximately 140 mils, a width of approximately 20 mils and a height (i.e., a thickness) of approximately 20 mils. Each plug blade 241-248 also includes a base column 249 (see FIG. 13) that extends from a bottom surface of the plug blade. The printed circuit board 250 includes eight metal-plated vias 231-238 that are arranged in two rows along the front edge thereof (only vias 231 and 238 are labeled in FIG. 13 to simplify the drawing). The base column 249 of each plug blade 241-248 is received within a respective one of the metal-plated vias 231-238 where it may be press-fit, welded or soldered into place to mount the plug blades 241-248 on the printed circuit board 250.

The plug blades 241-248 may be mounted to the printed circuit board 250 in other ways. For example, in other embodiments, elongated contact pads may be provided on the top surface of the printed circuit board 250 and each plug blade 241-248 may be welded or soldered to a respective one of these contact pads. It will be appreciated that many other attachment mechanisms may be used.

Turning again to FIGS. 11-14 it can be seen that a plurality of conductive paths 261-268 are provided on the top and bottom surfaces of the printed circuit board 250. Each of these conductive paths 261-268 electrically connects one of the plated pads 251-258 to a respective one of the metal-plated vias 231-238 so as to provide an electrical path between each of the conductors 201-208 that are terminated onto the plated pads 251-258 and a respective one of the plug blades 241-248 that are mounted in the metal-plated vias 231-238. Each conductive path 261-268 may comprise, for example, one or more conductive traces that are provided on one or more layers of the printed circuit board 250. When a conductive path 261-268 includes conductive traces that are on multiple layers of the printed circuit board 250 (i.e., conductive paths 264, 265 and 268 in the depicted embodiment), metal-plated or metal-filled through holes (or other layer-transferring structures known to those skilled in this art) may be provided that provide an electrical connection between the conductive traces on different layers of the printed circuit board 250.

A total of four differential transmission lines 271-274 are provided through the plug 216. The first differential transmission line 271 includes the end portions of conductors 204 and 205, the plated pads 254 and 255, the conductive traces 264 and 265, the plug blades 244 and 245, and the metal-plated vias 249 that are used to mount plug blades 244 and 245. The second differential transmission line 272 includes the end portions of conductors 201 and 202, the plated pads 251 and 252, the conductive traces 261 and 262, the plug blades 241 and 242, and the metal-plated vias 249 that are used to mount plug blades 241 and 242. The third differential transmission line 273 includes the end portions of conductors 203 and 206, the plated pads 253 and 256, the conductive traces 263 and 266, the plug blades 243 and 246, and the metal-plated vias 249 that are used to mount plug blades 243 and 246. The fourth differential transmission line 274 includes the end portions of conductors 207 and 208, the plated pads 257 and 258, the conductive traces 267 and 268, the plug blades 247 and 248, and the metal-plated vias 249 that are used to mount plug blades 247 and 248.

As shown in FIGS. 11-14, the two conductive traces 261-268 that form each of the differential transmission lines 271-274 on the printed circuit board 250 are generally run together, side-by-side, on the printed circuit board 250. Running the conductive traces 261-268 of each differential transmission line 271-274 side-by-side may provide improved impedance matching so that each segment of a particular transmission line may have a relatively constant impedance. This approach may make it easier to model the performance of the transmission line and hence to design a transmission line that meets pre-selected performance criteria. As shown best in FIGS. 13 and 14, the conductive traces 264, 265 that are part of the transmission line 271 and the conductive traces 263, 266 that are part of the transmission line 273 each traverse the printed circuit board 250 at an angle with respect to the longitudinal axis of the printed circuit board 250. These angled conductive traces are merely used for routing purposes to connect a pair of conductors (e.g., conductors 204 and 205) that are located on one side of the longitudinal axis of the printed circuit board 250 to the metal-plated vias 234, 235, which span the longitudinal axis of the printed circuit board 250.

A plurality of offending crosstalk circuits are also included on the printed circuit board 250. In particular, a total of five offending crosstalk capacitors 281-285 are provided adjacent the plug blades 241-248. Capacitor 281 injects offending crosstalk between blades 241 and 242, capacitor 282 injects offending crosstalk between blades 242 and 243, capacitor 283 injects offending crosstalk between blades 243 and 244, capacitor 284 injects offending crosstalk between blades 245 and 246, and capacitor 285 injects offending crosstalk between blades 246 and 247. Additionally, an inductive coupling section 286 is included between conductive traces 266 and 267 which injects offending inductive crosstalk between transmission lines 273 and 274 in order to meet the specified offending FEXT requirements in the Category 6a standard. The offending crosstalk circuits 281-286 may be provided, for example, to ensure that the plug 216 meets all of the pair-to-pair offending crosstalk specifications required by an industry standards document such as the aforementioned ANSI/TIA-568-C.2 standard. Unfortunately, these offending crosstalk circuits 281-286 appear as loads along each of the transmission lines 271-274 through the plug 216 that may make it difficult for the plug 216 to meet target return loss performance specifications, particularly at higher frequencies (e.g., frequencies above 500 MHz and even more so with respect to frequencies above 1 Ghz or above 1.5 GHz).

As discussed above, the communications connectors according to embodiments of the present invention may include two or more impedance mismatches along one or more of their transmission lines that improve the return loss on each transmission line over a desired frequency range. These impedance mismatches may create resonances that may be tuned to provide improved return loss and/or insertion loss performance for the transmission line over selected frequency ranges. The impedance mismatches can be implemented, for example, by changing the width or thickness of the conductors that form the differential transmission line segments or by changing the spacing of the conductors or the dielectric constants of the insulating materials that are adjacent to the conductors. By carefully selecting the degree of these impedance mismatches and the delays between the mismatches it is possible to significantly improve the return loss performance of the transmission line over a selected frequency range.

As is also shown in FIGS. 13 and 14, one or more reflection or "image" planes can be included in the plug 216. In the embodiment of FIGS. 7-14, two image planes 290, 292 are included in the plug 216, the first of which is located just below a top surface of the printed circuit board 250, and a second of which is located just above a bottom surface of the printed circuit board 250. Each image plane 290, 292 may be implemented as a conductive layer on the printed circuit board 250. In some embodiments, the image planes 290, 292 may be grounded by, for example, connecting each image plane to a ground wire, drain wire or other ground reference so that each image plane 290, 292 will act as a ground plane. However, in other embodiments, the image planes 290, 292 may not be electrically grounded (i.e., they are left floating electrically). The image planes 290, 292, whether or not they are electrically grounded, may act as shielding structures that reduce coupling between the portions of conductive traces 261-268 that are on the top side of the printed circuit board 250 and the portions of conductive traces 261-268 that are on the bottom side of the printed circuit board 250.

The image planes 290, 292 may also be used to control the impedance of the transmission lines 271-274. In particular, the impedance of each differential transmission line is impacted by the distance of the conductors of the transmission line 271-274 from the image plane(s) 290, 292. Thus, another way of creating impedance mismatches along one or more of the transmission lines 271-274 in the plug 216 is to vary the distance of the conductors that form the transmission line from one of the image planes 290, 292.

In the plug 216, the impedance mismatches are created by varying the widths of the conductive traces 261-268, varying the spacings between the conductive traces 261-268 and by varying the distances of the conductive traces from the image planes 290, 292 For example, conductive trace 261 includes a first transition point 261-1 where the trace narrows, a second transition point 261-2 where the trace narrows further, and a third transition point 261-3 where the trace widens. Each of these transition points 261-1 through 261-3 creates an impedance mismatch. Likewise, conductive trace 262 includes a first transition point 262-1 where the trace narrows and a second transition point 262-2 where the trace narrows further. These transition points create multiple impedance mismatches along transmission line 272. Thus, multiple impedance mismatches are created along transmission line 272.

In a similar fashion, transition points 263-1 and 263-2 are provided on conductive trace 263, and transition points 266-1 and 266-2 are provided on conductive trace 263. Additionally, near the front of the printed circuit board 250 conductive traces 263 and 267 split apart in order to be routed to their respective plug blades 243 and 246. This increase in the spacing between conductive traces 263 and 266 create additional transition points 263-3 and 266-3. These transition points create multiple impedance mismatches along transmission line 273.

Similarly, conductive trace 267 of transmission line 274 includes two right angle turns adjacent the front edge of printed circuit board 250 that vary the spacing between conductive path 267 and its counterpart conductive path 268. This variation in spacing creates additional impedance mismatches on conductive paths 267 and 268, respectively. Additional impedance mismatches are injected on transmission line 274 via the transition points 267-1 and 268-1 that are provided on traces 267 and 268. Thus, multiple impedance mismatches are also generated along transmission line 274.

Finally, conductive trace 264 includes a first transition point 264-1 where the trace narrows, and conductive trace 265 likewise includes a first transition point 265-1 where the trace narrows. These transition points 264-1 through 265-1 create impedance mismatches. Another impedance mismatch occurs in the conductive vias that are used to transition the conductive traces from the top side of printed circuit board 250 to the bottom side of the printed circuit board 250. The wide separation between conductive traces 264 and 265 near the front portion of printed circuit board 250 (i.e., on the bottom side of the board) also contributes to the impedance mismatch and further increases inductive coupling between transmission lines 271 and 273 for purposes of meeting the crosstalk specifications for plug 216. Thus, multiple impedance mismatches are also created along transmission line 271.

It can also be seen in FIGS. 13 and 14 that the image planes 290, 292 do not extent all the way forwardly to the front edge of the printed circuit board 250. Another impedance mismatch is created where at the point where a conductive trace starts to extend beyond the front edge of an image plan, such as at transition points 261-2 and 262-2 for the conductive traces of transmission line 272.

As discussed above, the number of impedance mismatches included on the conductors of a differential transmission line, the size of each impedance match, and the delays between impedance mismatches may be selected to enhance the return loss performance of the transmission line in a pre-selected frequency range. Trial and error approaches may be used to find a transmission line design that achieves desired performance levels, although computer programs may readily be developed that may be used to better optimize return loss performance.

Figure 15:
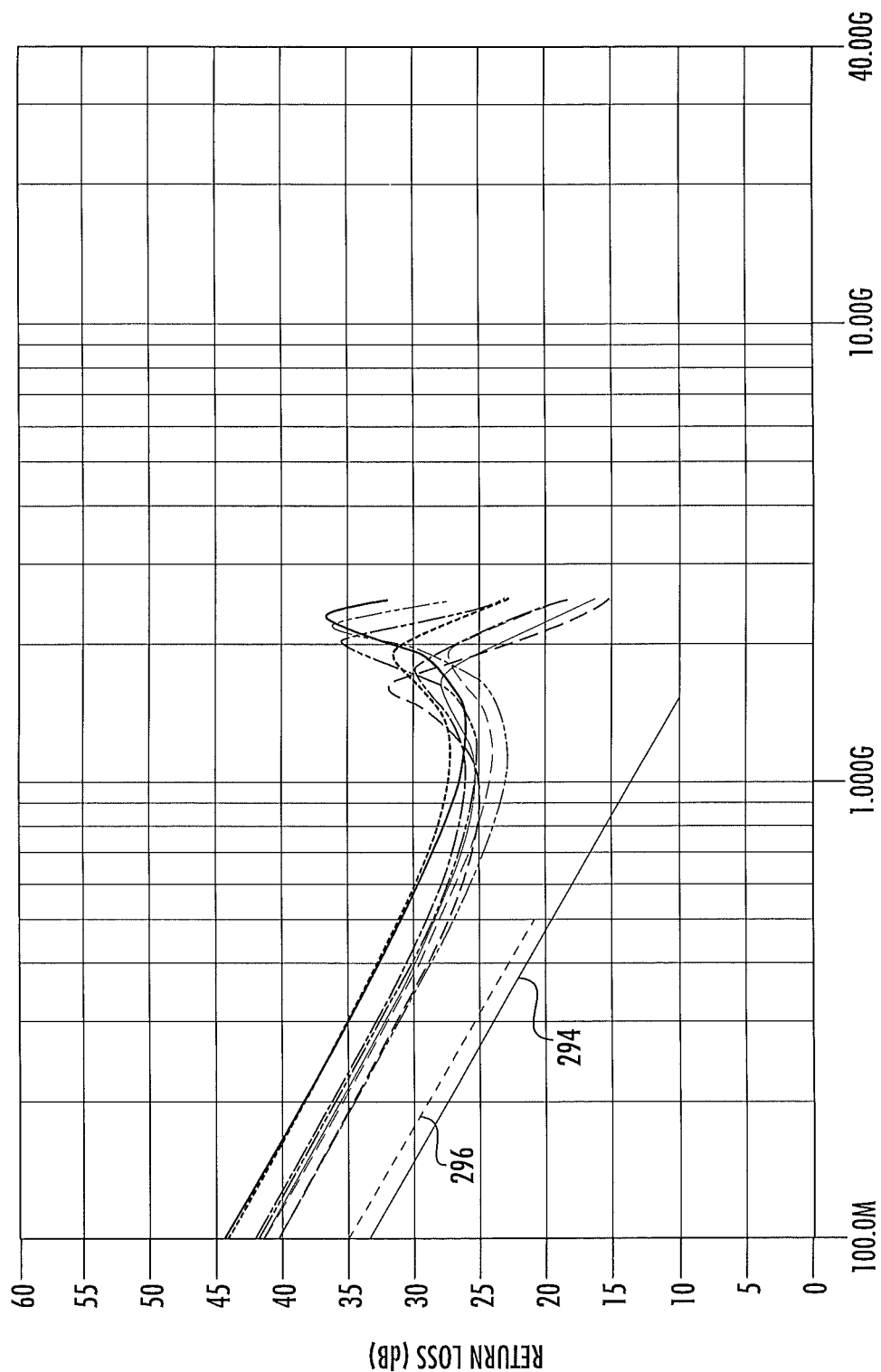
FIG. 15 is a graph illustrating the simulated return loss performance of the communications plug of FIGS. 8-14.

FIG. 15 is a graph illustrating the simulated return loss performance of the communications plug 216 of FIGS. 8-14. In FIG. 15, the solid curves illustrate the simulated return loss on transmission lines 271-274 for signals passing in the forward direction through plug 216 (i.e., from the cable attached to the plug 216 to a mating jack), while the curves drawn using dotted lines illustrate the simulated return loss on transmission lines 271-274 for signals passing in the reverse direction through plug 216 (i.e., from a mating jack into the plug 216). Curve 294 represents the minimum magnitude requirement for the Category 6a standard return loss (extrapolated above the Cat 6A requirement, which ends at 500 MHz). Curve 296 is the threshold above which the phase of the return loss need not be controlled. As is readily apparent, these simulations indicate that return loss margins of at least 6 dB are provided on all four transmission lines 271-274 at frequencies above 500 MHz.

Figure 16:
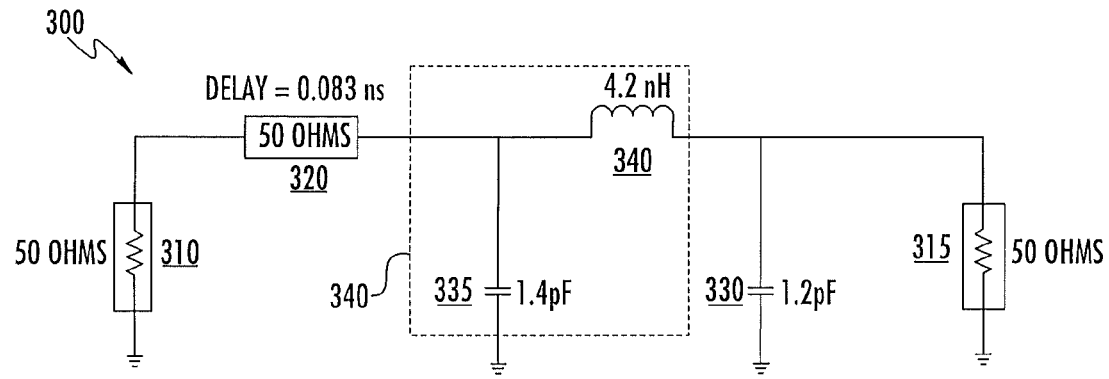
FIG. 16 is a circuit diagram of a model of a differential transmission line through a communications plug that illustrates how the impedance imbalances may alternatively be implemented using discrete reactive components.

The resonances that are used to improve return loss on the transmission lines of connectors according to embodiments of the present invention may also be implemented using discrete elements. For example, FIG. 16 illustrates an alternative circuit model for the transmission line of FIG. 5. As shown in FIG. 16, the transmission line 100' of FIG. 5 may alternatively be implemented as a transmission line 300 which includes a signal source with internal series termination 310, a transmission line segment 320, an end termination 315, and a pi filter 340 which comprises a first 1.4 pF shunt capacitor 342, the capacitive load 330 (1.2 pF) and a series 4.2 nH inductor 344 therebetween Each of the terminations 310, 315 are 50 ohm terminations, as is the transmission line segment 320. The transmission line segment 320 is modeled as having a length that results in a delay of 0.083 nanoseconds (i.e., an RF signal will traverse each transmission line segment in 0.083 nanoseconds).

Figure 17:
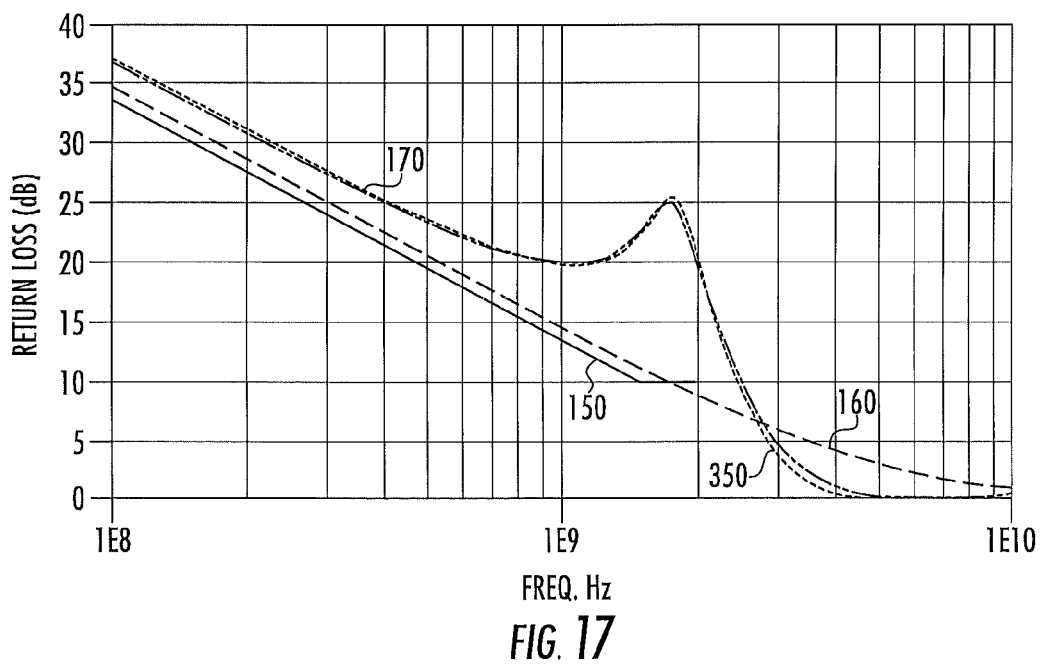
FIG. 17 is a graph illustrating the close match in the return loss performance of the transmission lines of FIGS. 5 and 16.

FIG. 17 illustrates the return loss of the transmission line 100' of FIG. 5 (curve 170) as compared to the return loss of the transmission line 300 of FIG. 16 (curve 350). As is readily apparent, the two curves are almost identical, which shows that the impedance mismatches create a low pass filtering effect that results in a local maximum in the return loss spectra that may be used to improve the return loss of the transmission line in a selected frequency range.

Pursuant to embodiments of the present invention, techniques are disclosed for improving the return loss performance of communications connectors, particularly at higher frequencies (e.g., frequencies above 500 MHz), as well as communications connectors that exhibit such improved return loss performance. The techniques according to embodiments of the present invention may be particularly suitable for use in Category 8 connectors that maintain backwards compatibility with the Category 6a standard, as the amount of offending crosstalk compensating crosstalk that is typically included in Category 6a standards-compliant connectors may appear as loads on the transmission lines through the connectors that can make it difficult to maintain good return loss performance at higher frequencies.

Figure 18:
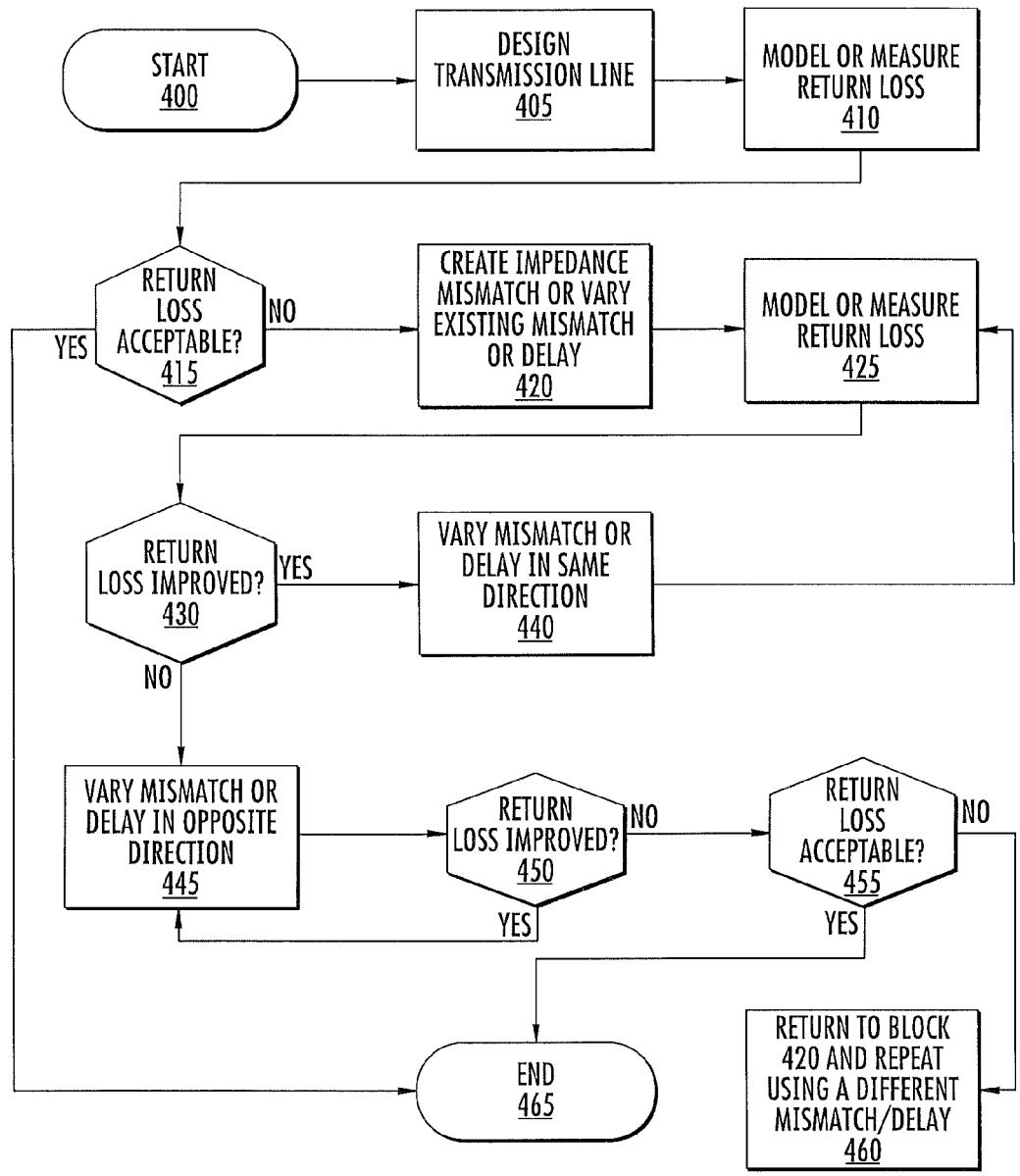
FIG. 18 is a flow chart illustrating operations for designing a transmission line through a communications connector according to embodiments of the present invention.

FIG. 18 is a flow chart that illustrates a method of designing a transmission line for a communications connector according to certain embodiments of the present invention. As shown in FIG. 18, operations may start at block 400 with a circuit designer designing a transmission line of the connector (block 405). This transmission line model may take into account loads that are placed on the transmission line such as crosstalk that is received from other transmission lines in the connector, transmission lines in adjacent connectors, etc. Once an initial design for the transmission line has been prepared, modeling techniques may be used to simulate the return loss performance of the transmission line, or alternatively, a test circuit may be built and the return loss performance may be measured (block 410). At block 415, a determination is made as to whether or not the modeled or measured return loss performance is acceptable. If it is, operations may then end (block 465). If not, operations may then continue to block 420, where the transmission line design is modified to include an impedance mismatch, the magnitude of an existing impedance mismatch is varied, and/or the delay between two impedance matches is varied.

Next, modeling techniques (or, alternatively, actual measurements) may be used to simulate the return loss performance of the modified transmission line design (block 425). At block 430, a determination is then made as to whether or not the return loss performance of the transmission line was improved in a desired fashion (e.g., within a certain frequency range) by the modifications of block 420. If so, operations may proceed to block 440 where the change that was made to the transmission line design at block 420 is then increased further. For example, if at block 420, an impedance mismatch was increased by 5%, then at block 440, that same impedance mismatch may be increased by another 5%. As another example, if at block 420, an impedance mismatch was decreased by 5%, then at block 440, that same impedance mismatch may be decreased by another 3%. Operations then proceed back to block 425 where the return loss may be modeled again, and then operations proceed to block 420.

If, at block 430 it is determined that the return loss performance was not improved, then operations proceed to block 445 where the change that was made to the transmission line design at block 420 is then removed and instead a change to the impedance mismatch or delay is made in the opposite direction. For example, if at block 420, an impedance mismatch was increased by 5%, then at block 445, the 5% increase in the impedance mismatch may be omitted and instead replaced with a 3% reduction in the impedance mismatch. Operations may then proceed to block 455, where a determination is made as to whether the return loss performance is acceptable. If it is, operations may end (block 465). If not, operations may return to block 420 and another impedance mismatch may be created or a different impedance mismatch or delay may be varied.

According to further embodiments of the present invention, the design method of FIG. 18 may be modified as follows. After designing the transmission line at block 405, measurements or simulation may be used to determine an approximate total value of the capacitive impairment $C_{imp}$ on the transmission line. This capacitive impairment value Cimp may include both within pair coupling and coupling to other transmission lines. Then at block 420, a box section filter may be created by adding between the conductors of the transmission line at issue a capacitor $C_{in}$ that has a value of approximately $C_{imp}$, and by further adding two inductors L+ and L−, each which have an initial value of $1/(4*pi^2*C_{imp}*f^2)$, where f is the upper limit of the frequency range over which the return loss is to be improved. If this results in acceptable return loss performance, the method may then be terminated. If not, the values of one or more of $C_{imp}$, L+ and/or L− may be adjusted and the return loss performance may be re-simulated until acceptable return loss performance is achieved.

In some embodiments, communications connectors such as communications plugs (and patch cords that include such plugs) are provided that meet pre-determined performance criteria. For example, in some embodiments, communications plugs are provided that comply with the offending pair-to-pair crosstalk specifications set forth in the Category 6a standard, which is incorporated herein by reference, while each transmission line through the plug also maintains an average return loss of at least 15 dB over the frequency range from 1.0 GHz to 2.0 GHz. In other embodiments, these plugs can exhibit even higher return loss performance while complying with the offending pair-to-pair crosstalk specifications set forth in the Category 6a standard, such as having each transmission line through the plug maintain an average return loss of at least 20 dB over the frequency range from 1.0 GHz to 2.0 GHz or having each transmission line through the plug maintain an average return loss of at least 18 dB over the frequency range from 500 MHz to 1.5 GHz.

Figure 19:
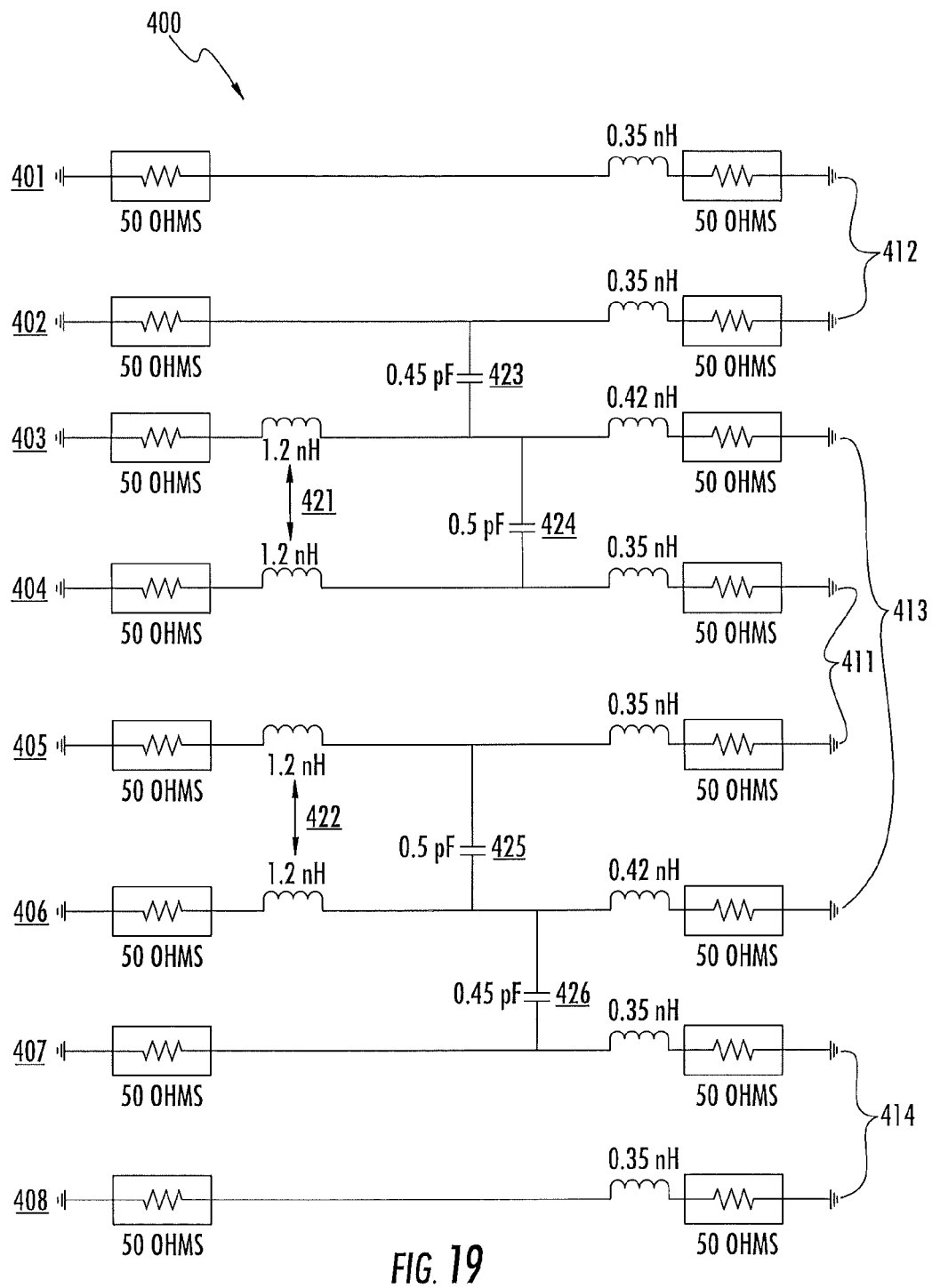
FIG. 19 is a circuit diagram of a model of a conventional Cat 6A test plug.

Pursuant to some embodiments of the present invention, the techniques discussed above may also be used to improve the return loss performance and/or the insertion loss performance of Cat 6a plugs. By way of example, FIG. 19 is a circuit diagram of a model of a conventional Cat 6a test plug 400. As shown in FIG. 19, the plug 400 includes a total of eight conductive paths 401-408 that are arranged a four differential transmission lines 411-414. The plug 400 includes a plurality of loads including a first mutual inductance 421 where transmission lines 403 and 404 inductively couple and a second mutual inductance 422 where transmission lines 405 and 406 inductively couple, as well as capacitive couplings 423-426. The loads 421-426 may be provided so that the plug meets the crosstalk requirements set forth in the Cat 6a standard.

Figure 20:
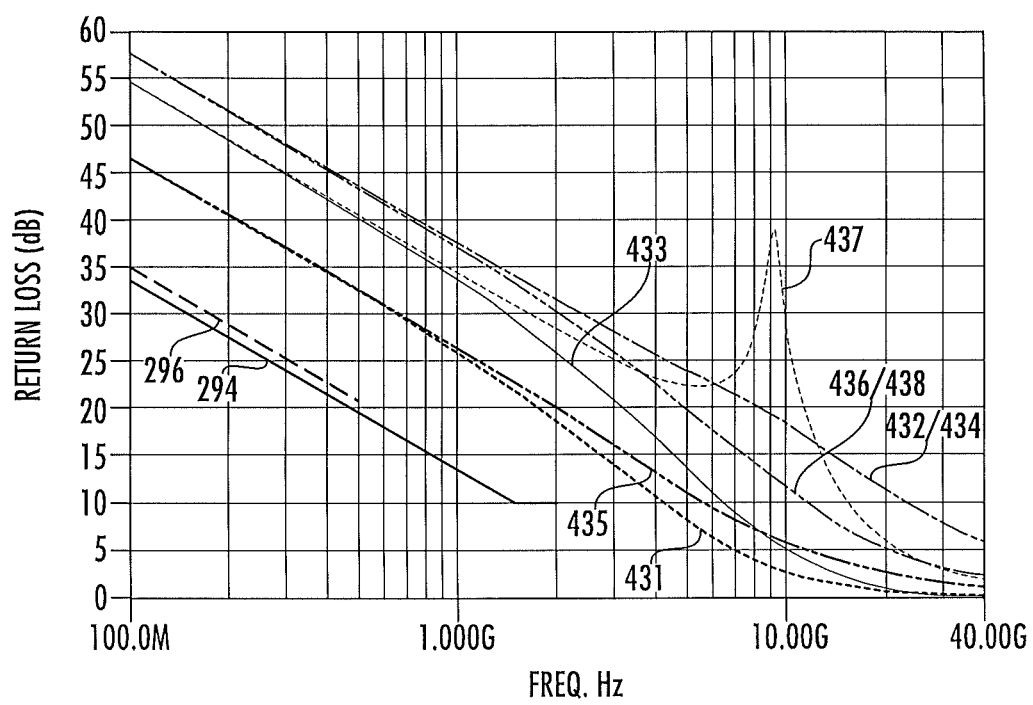
FIG. 20 is a graph illustrating the simulated return loss performance of the transmission lines of the communications plug of FIG. 19.

FIG. 20 illustrates the simulated return loss of the plug 400 of FIG. 19. In FIG. 20, curves 431-434 indicate the return loss on the four transmission lines 411-414, respectively, in the forward direction, and curves 435-438 indicate the return loss on the four transmission lines 411-414, respectively, in the reverse direction (note that curves 432 and 434 overlap exactly and that curves 436 and 438 overlap exactly, so that FIG. 20 appears to only have six curves as opposed to eight curves). As shown in FIG. 20, the test plug 400 may provide good performance. However, the plug 400 may also be difficult to implement. As is also shown in FIG. 20, inadvertent resonance occurs on at least some of the differential pairs, including a very clear resonance on pair 3 in the reverse direction (curve 437) which results in a local maxima in the return loss on that pair. However, as is also apparent from FIG. 20, the improvement in return loss that is provided by this inadvertent resonance occurs well outside the frequency range of interest, and hence does nothing to improve the performance of the plug 400.

Figure 21:
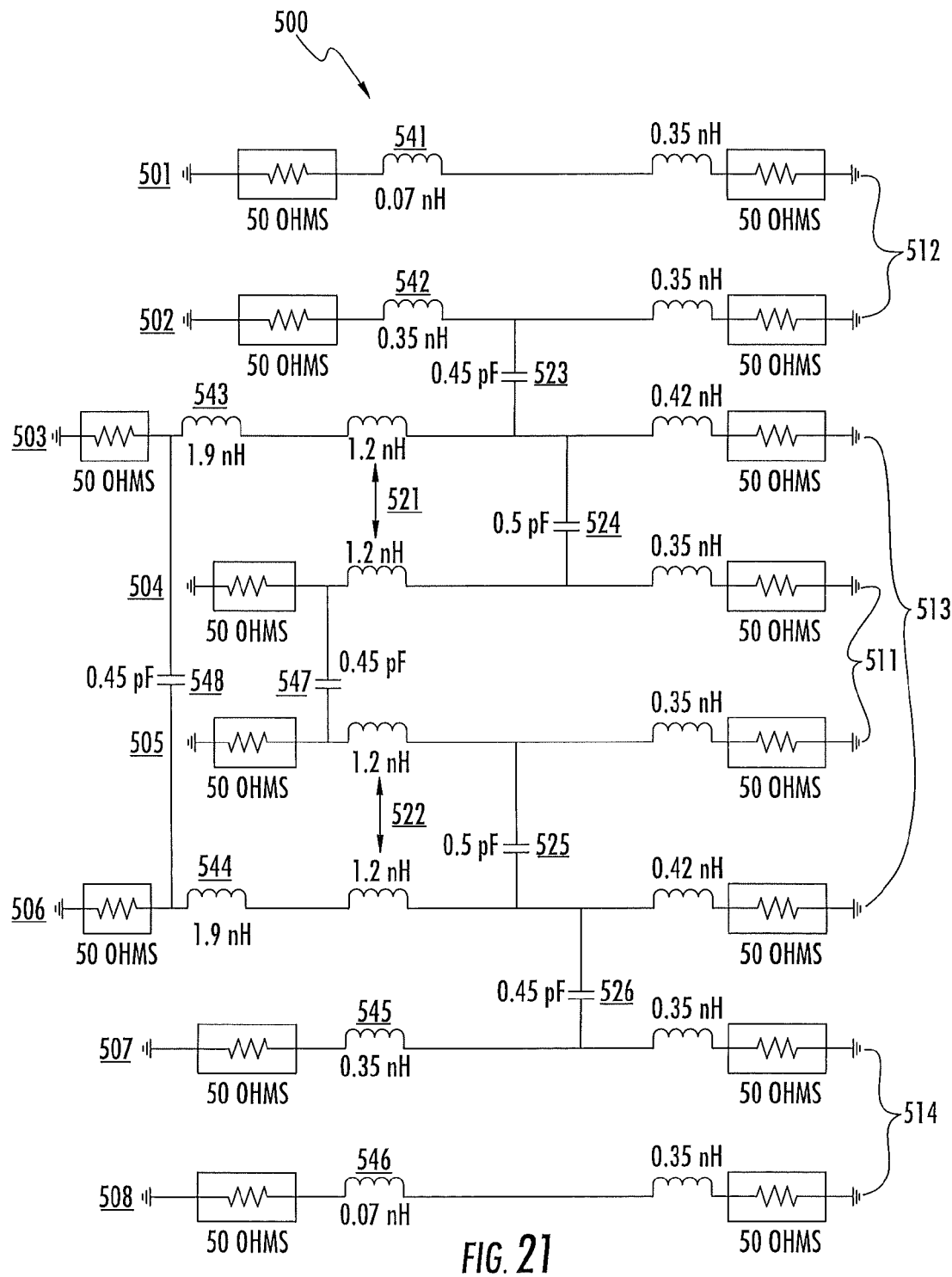
FIG. 21 is a circuit diagram of a model of the Cat 6A test plug of FIG. 19 that further includes discrete elements that provide return loss and insertion loss enhancements.

Pursuant to embodiments of the present invention, Cat 6a plugs may be provided that exhibit improved return loss performance. For example, FIG. 21 is a circuit diagram of a Cat 6a plug 500 that includes discrete elements that generate impedance mismatches that are tuned to improve return loss and insertion loss performance. As shown in FIG. 21, the plug 500 is similar to the plug 400 of FIG. 19 (note that elements 521-526 of plug 500 correspond exactly to elements 421-426 of plug 400), but the plug 500 further includes additional discrete elements 541-548 that create impedance mismatches that are tuned to provide enhanced return loss performance.

Figure 22:
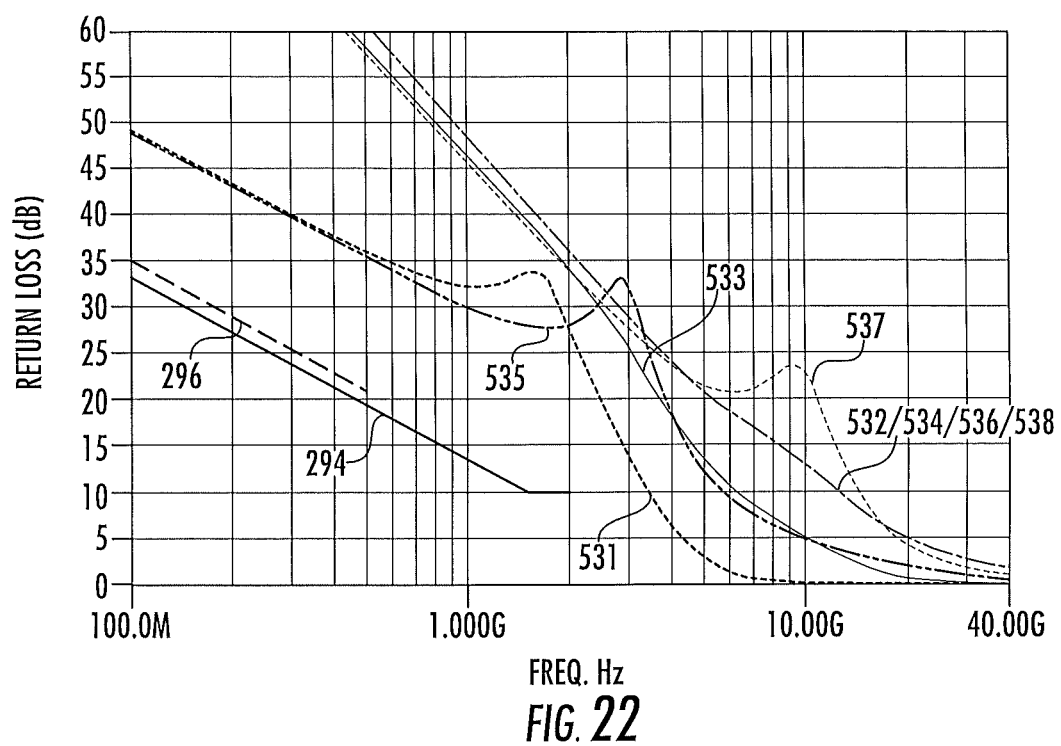
FIG. 22 is a graph illustrating the simulated return loss performance of the transmission lines of the communications plug of FIG. 21.

FIG. 22 illustrates the simulated return loss of the plug 500 of FIG. 21. In FIG. 22, curves 531-534 indicate the return loss on the four transmission lines 511-514, respectively, in the forward direction, and curves 535-538 indicate the return loss on the four transmission lines 511-514, respectively, in the reverse direction (note that curves 532, 534, 536 and 538 overlap exactly so that FIG. 22 appears to only have five curves as opposed to eight curves). As shown in FIG. 22, the test plug 500 may provide excellent performance, and may provide significantly better return loss performance as compared to the plug 400.

Figure 23:
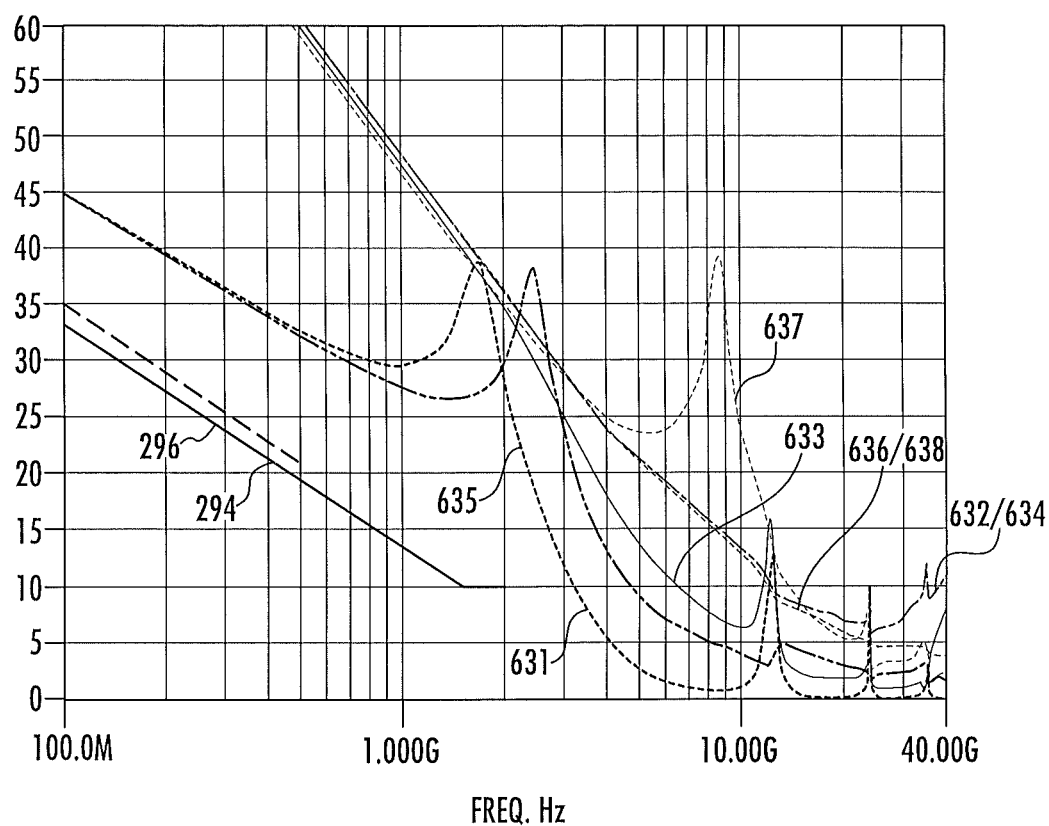
FIG. 23 is a graph illustrating the simulated return loss performance of the transmission lines of a model of the Cat 6A test plug of FIG. 19 that includes both discrete elements and transmission line impedance imbalances that together provide return loss and insertion loss enhancements.

FIG. 23 is a graph illustrating the simulated return loss performance of the transmission lines of another model of a Cat 6A plug that includes both discrete elements and transmission line impedance imbalances that together provide return loss and insertion loss enhancements. In FIG. 23, curves 631-634 indicate the return loss on the four transmission lines through the plug in the forward direction, and curves 635-638 indicate the return loss on the four transmission lines 511-514 through the plug in the reverse direction (note that curves 632, 634, 636 and 638 overlap exactly so that FIG. 23 appears to only have five curves as opposed to eight curves). As shown in FIG. 23, this that also provides excellent return loss performance. Additionally, as can be seen in FIG. 23 a plurality of peaks are generated in the return loss spectra for some of the pairs.

Pursuant to further embodiments of the present invention, methods of improving the return loss on a transmission line through a communications connector are provided in which a plurality of impedance mismatches are intentionally provided along the transmission line. These impedance mismatches may be caused by, for example, loads provided along the transmission line due to crosstalk circuits, discrete elements added along the transmission line to create impedance mismatches, and/or by changes in the characteristics of the transmission line (e.g., changing the width, thicknesses or spacing of the conductors thereof, changing the dielectric constants of surrounding materials, changing the relationship of the conductors with respect to image planes, etc.). Then, the magnitude of one or more of the impedance mismatches, the delay between one or more of the impedance mismatches and/or the number of impedance mismatches provided may be adjusted in order to reduce a rate of decrease in the return loss of the transmission line as a function of increasing frequency within a desired frequency operating range of the transmission line.

In some embodiments, the transmission line may be a differential transmission line through a plug of a patch cord. In some embodiments, the rate of decrease in the return loss of the transmission line as a function of increasing frequency may be reduced sufficiently such that a local maxima is generated in the return loss spectra.

While embodiments of the present invention have been described above primarily with respect to communications plugs, it will be appreciated that the techniques disclosed herein are equally applicable to communications jacks.

While the above embodiments have focused on connectors that include printed circuit boards, it will be appreciated that the techniques according to embodiments of the present invention may be implemented in connectors that do not include printed circuit boards such as plugs or jacks that use lead frame implementations.

While the above embodiments have focused on connectors that include differential transmission lines, it will be appreciated that the techniques according to embodiments of the present invention may also be implemented in connectors that use single-ended transmission lines. For example, in further embodiments, plugs may be provided in which one or more of the differential pairs are implemented as two single-ended transmission lines that have very low coupling with each other (and with the conductors of the remaining pairs) as opposed to using a single differential transmission line.

The present invention is not limited to the illustrated embodiments discussed above; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "top," "bottom," "side," "upper," "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The present invention is directed to communications connectors such as RJ-45 plugs. As used herein, the terms "forward" and "front" and derivatives thereof refer to the direction defined by a vector extending from the center of the plug toward the portion of the plug that is first received within a plug aperture of a jack when the plug is mated with a jack. Conversely, the term "rearward" and derivatives thereof refer to the direction directly opposite the forward direction.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A patch cord comprising:
a communications cable that includes at least a first conductor, a second conductor, a third conductor and a fourth conductor; and
a plug that is attached to a first end of the communications cable, the plug comprising:
a housing that receives the communications cable;
a first plug contact, a second plug contact, a third plug contact and a fourth plug contact that each are at least partially within the housing;
a first conductive path that connects the first conductor to the first plug contact, a second conductive path that connects the second conductor to the second plug contact, a third conductive path that connects the third conductor to the third plug contact, and a fourth conductive path that connects the fourth conductor to the fourth plug contact,
wherein the first and second conductors, the first and second conductive paths, and the first and second plug contacts form a first differential transmission line through the plug and the third and fourth conductors, the third and fourth conductive paths, and the third and fourth plug contacts form a second differential transmission line through the plug, and
wherein the first differential transmission line includes at least a first segment having a first impedance, a second segment having a second impedance, and a third segment having a third impedance, wherein the second segment is between the first and third segments, and wherein the first impedance is different than the second impedance and the second impedance is different than the third impedance, and
wherein the first, second and third impedances and/or the electrical lengths of the first, second and third sections are selected to provide a local maximum in the return loss spectra of the first differential transmission line.

2. The patch cord of claim 1, wherein the first through fourth conductive paths each traverse a printed circuit board, and wherein the first segment of the first differential transmission line connects to the second segment of the first differential transmission line on the printed circuit board.

3. The patch cord of claim 2, wherein the plug comprises an RJ-45 plug.

4. The patch cord of claim 3, wherein the first plug contact is directly adjacent to the second plug contact.

5. The patch cord of claim 2, wherein the second segment of the first differential transmission line connects to the third segment of the first differential transmission line on the printed circuit board.

6. The patch cord of claim 2, wherein a first pair of conductive trace sections on the printed circuit board that form the first segment of the first differential transmission line have widths and/or thicknesses and/or distances from adjacent image plane(s) and/or effective dielectric constants that are different than the corresponding widths and/or thicknesses and/or image plane distance(s) and/or effective dielectric constants of a second pair of conductive trace sections on the printed circuit board that form the second segment of the first differential transmission line.

7. The patch cord of claim 2, wherein the impedance of the first segment of the first differential transmission line differs from the impedance of the second segment of the first differential transmission line by at least 20 percent, and wherein the impedance of the second segment of the first differential transmission line differs from the impedance of the third segment of the first differential transmission line by at least 20 percent.

8. The patch cord of claim 2, wherein the local maximum in the return loss spectra of the first differential transmission line is between a frequency of 1 GHz and a frequency of 5 GHz.

9. The patch cord of claim 1, wherein the local maximum in the return loss spectra of the first differential transmission line is positioned within the return loss spectra in order to extend the operating frequency range of the patch cord over which a minimum return loss margin may be maintained.

10. The patch cord of claim 1, wherein the local maximum in the return loss spectra of the first differential transmission line is within a pre-selected frequency range of an operating frequency range of the patch cord.

11. The patch cord of claim 1, wherein the local maximum in the return loss spectra of the first differential transmission line is at a frequency that is outside the operating frequency range of the patch cord.

12. The patch cord of claim 1, wherein the second differential transmission line includes at least a fourth segment having a fourth impedance, a fifth segment having a fifth impedance, and a sixth segment having a sixth impedance, wherein the fifth segment is between the fourth and sixth segments, wherein the fourth impedance is different than the fifth impedance and the fifth impedance is different than the sixth impedance, and wherein the fourth, fifth and sixth impedances are selected to provide a local maximum in the return loss performance of the second differential transmission line within the pre-selected frequency range.

* * * * *